US009443605B1

(12) United States Patent
Chen et al.

(10) Patent No.: US 9,443,605 B1
(45) Date of Patent: *Sep. 13, 2016

(54) TEMPERATURE DEPENDENT VOLTAGE TO UNSELECTED DRAIN SIDE SELECT TRANSISTOR DURING PROGRAM OF 3D NAND

(71) Applicant: SanDisk Technologies Inc., Plano, TX (US)

(72) Inventors: Jian Chen, San Jose, CA (US); Yingda Dong, San Jose, CA (US); Jiahui Yuan, Fremont, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/964,884

(22) Filed: Dec. 10, 2015

Related U.S. Application Data

(63) Continuation of application No. 14/673,265, filed on Mar. 30, 2015, now Pat. No. 9,245,642.

(51) Int. Cl.
    *G11C 16/04* (2006.01)
    *G11C 16/34* (2006.01)
    *G11C 16/10* (2006.01)
    *G11C 11/56* (2006.01)

(52) U.S. Cl.
    CPC ....... *G11C 16/3427* (2013.01); *G11C 11/5628* (2013.01); *G11C 16/0483* (2013.01); *G11C 16/10* (2013.01); *G11C 16/349* (2013.01); *G11C 16/3418* (2013.01)

(58) Field of Classification Search
    CPC .............. G11C 16/0483; G11C 16/10; G11C 16/3418; G11C 16/349

USPC ........... 365/185.17, 185.02, 185.14, 185.18, 365/195

See application file for complete search history.

(56) References Cited

U.S. PATENT DOCUMENTS

| 7,170,788 | B1 | 1/2007 | Wan et al. |
| 7,218,552 | B1 | 5/2007 | Wan et al. |
| 7,295,478 | B2 | 11/2007 | Wan et al. |
| 7,447,086 | B2 * | 11/2008 | Wan .................. G11C 16/3418 365/189.011 |
| 7,447,093 | B2 | 11/2008 | Li et al. |
| 7,463,528 | B2 | 12/2008 | Mokhlesi et al. |
| 7,471,567 | B1 | 12/2008 | Lee et al. |
| 7,583,535 | B2 | 9/2009 | Sekar et al. |
| 7,755,946 | B2 | 7/2010 | Dunga et al. |
| 7,876,618 | B2 | 1/2011 | Lee et al. |
| 9,245,642 | B1 * | 1/2016 | Chen .................. G11C 16/3427 |

(Continued)

OTHER PUBLICATIONS

U.S. Appl. No. 14/673,265, filed Mar. 30, 2015.

(Continued)

*Primary Examiner* — Gene Auduong
(74) *Attorney, Agent, or Firm* — Vierra Magen Marcus LLP

(57) ABSTRACT

Techniques are provided for reducing program disturb in a 3D memory device. The techniques include compensating for a temperature dependence of program disturb. The techniques may include compensating for how program disturb depends on the location of the word line that is selected for programming. In one aspect, the voltage that is applied to the control gates drain side select transistors of unselected NAND strings is adjusted during programming based on temperature. Greater temperature compensation may be applied when the selected word line is closer to the drain side select transistors.

20 Claims, 22 Drawing Sheets

(56) References Cited

U.S. PATENT DOCUMENTS

| | | |
|---|---|---|
| 9,286,994 B1* | 3/2016 | Chen .................. G11C 16/3427 |
| 2008/0089127 A1 | 4/2008 | Mokhlesi et al. |
| 2010/0238729 A1 | 9/2010 | Lee et al. |

OTHER PUBLICATIONS

Notice of Allowance dated Nov. 12, 2015, U.S. Appl. No. 14/673,265, filed Mar. 30, 2015.

International Search Report & the Written Opinion of the International Searching Authority dated Feb. 29, 2016, International Application No. PCT/US2015/062629.

Park, Ki-Tae, et al., "Three-Dimensional 128 Gb MLC Vertical nand Flash Memory With 24-WL Stacked Layers and 50 MB/s High-Speed Programming," IEEE Journal of Solid-State Circuits, vol. 50, No. 1, Dec. 24, 2014, pp. 204-213.

* cited by examiner

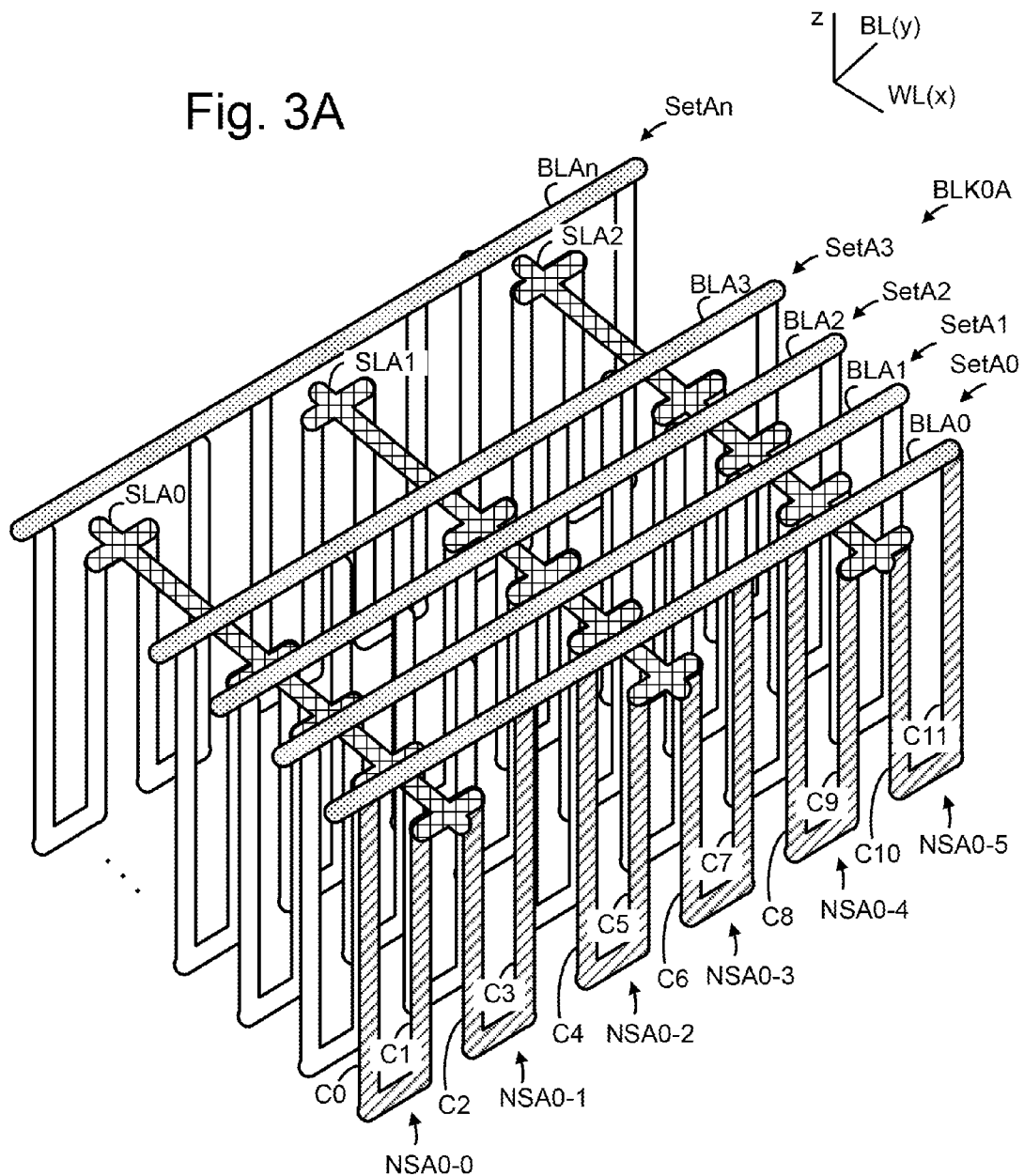

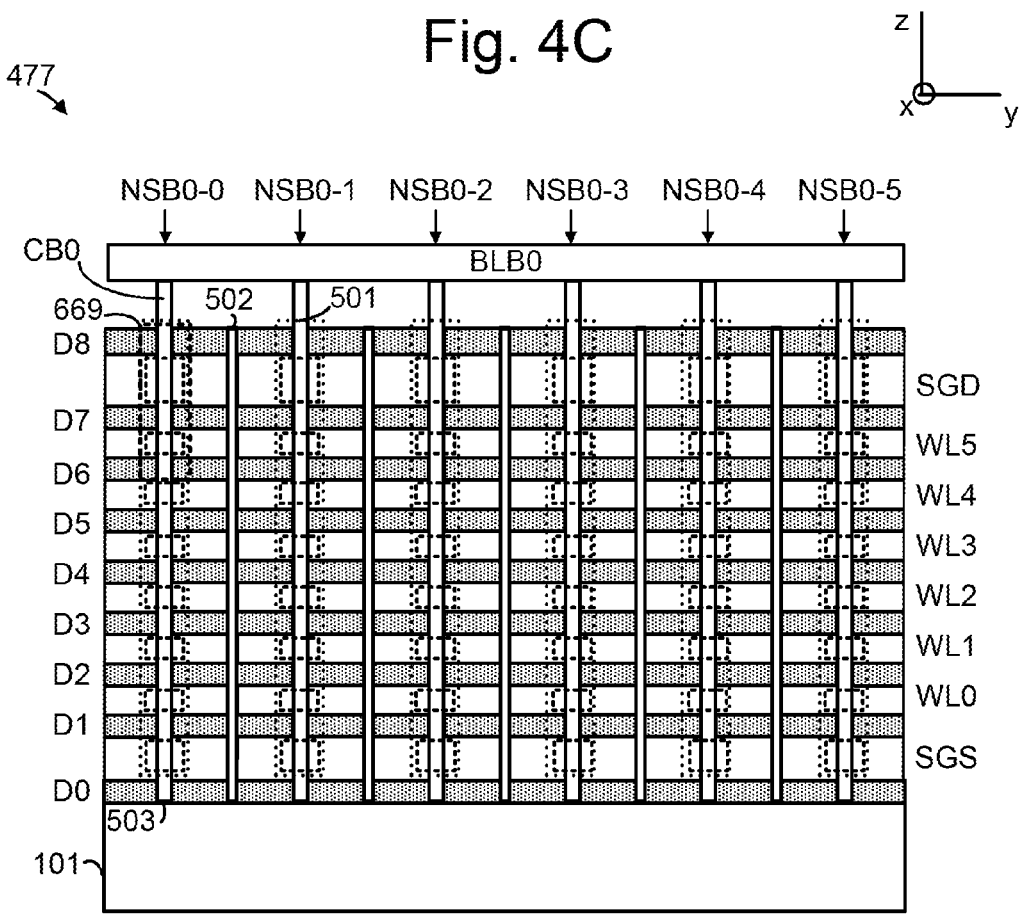

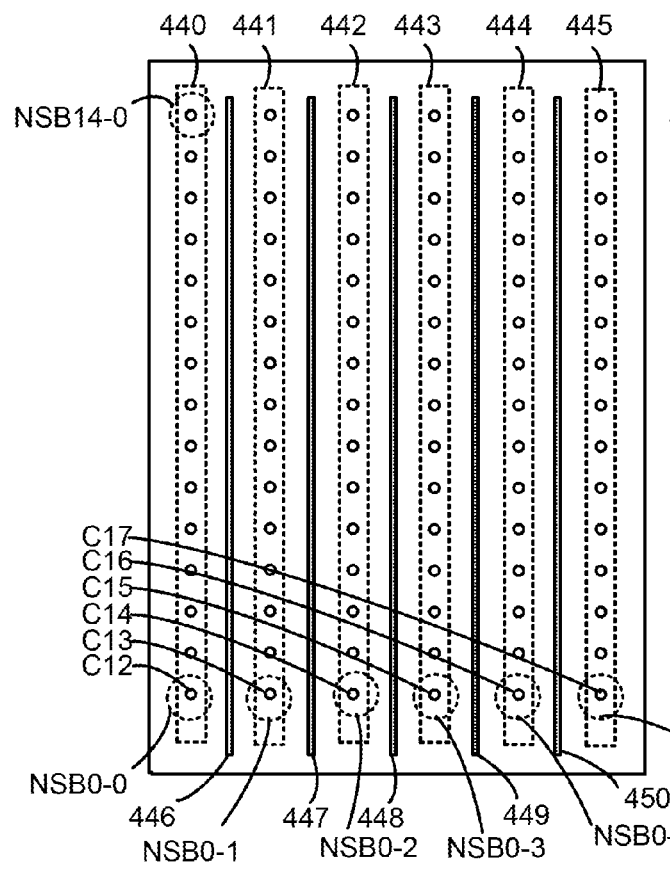
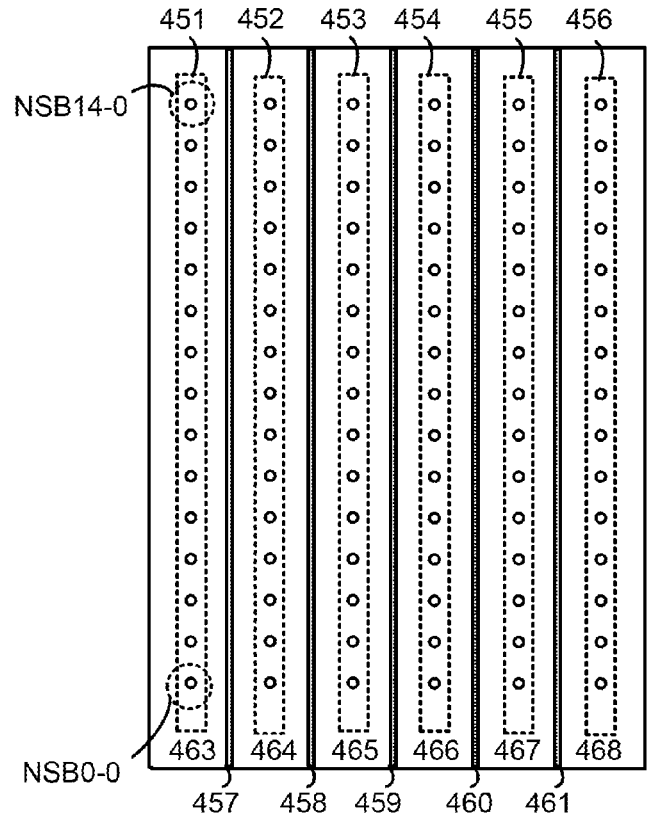

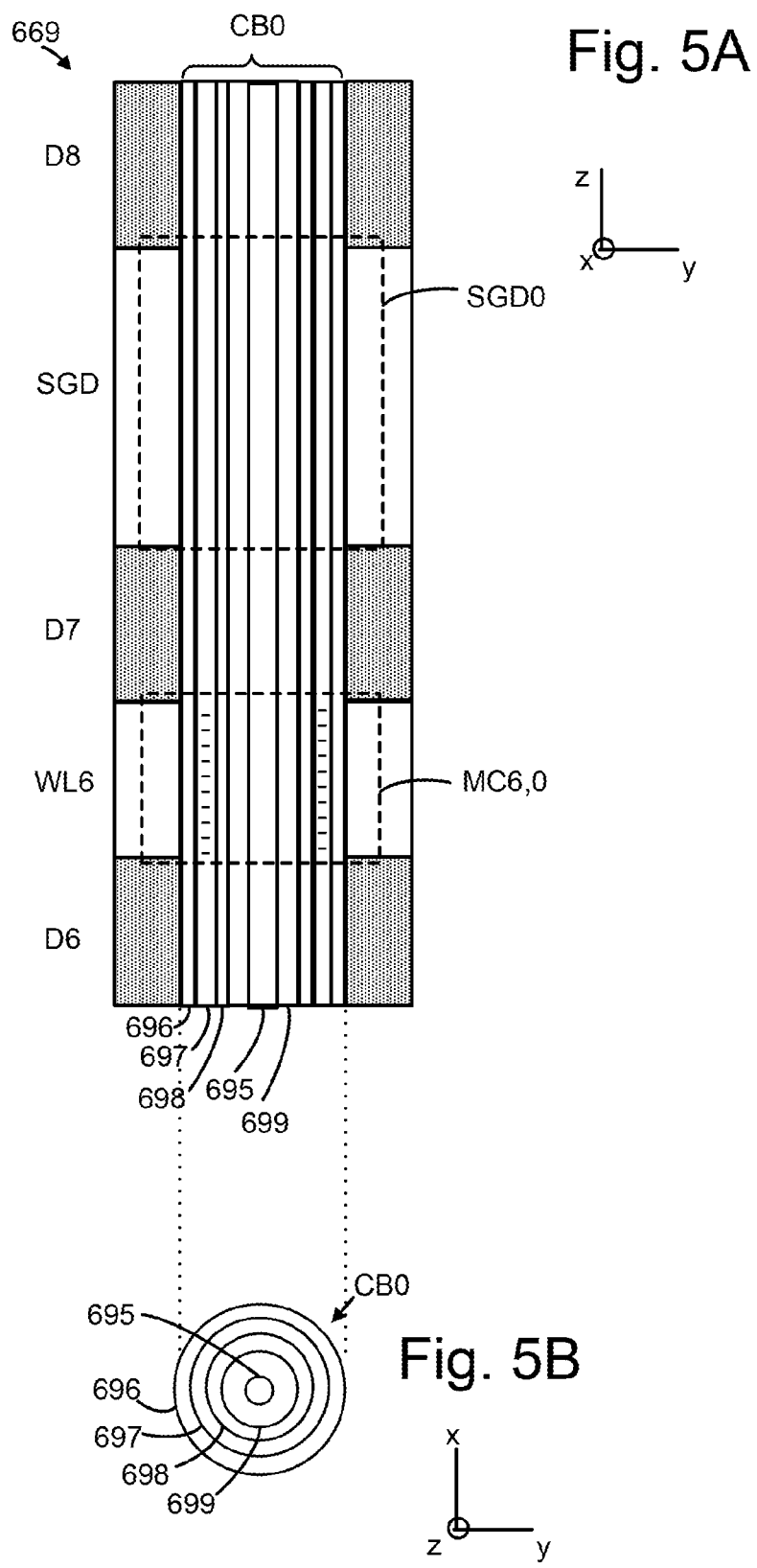

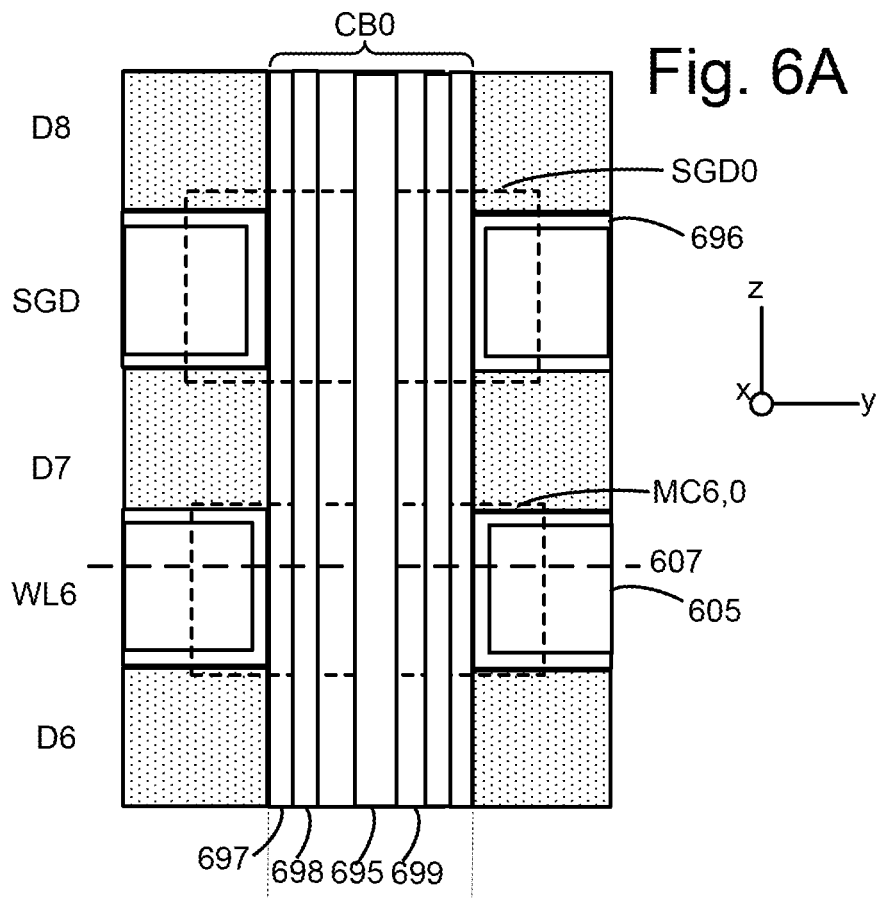
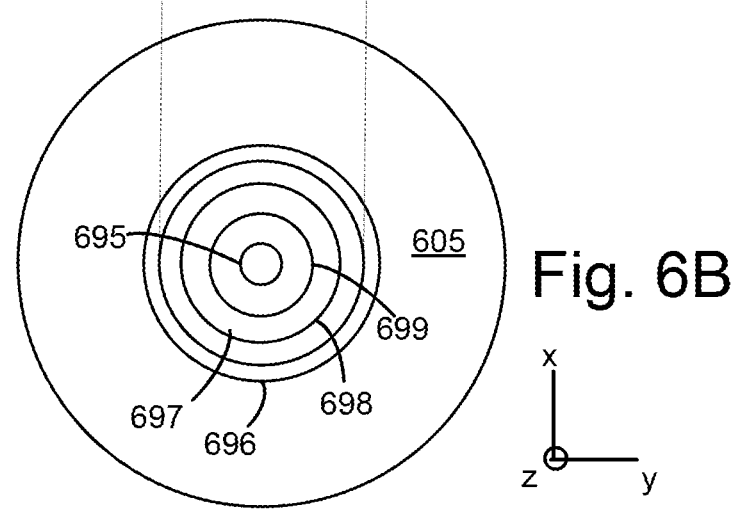

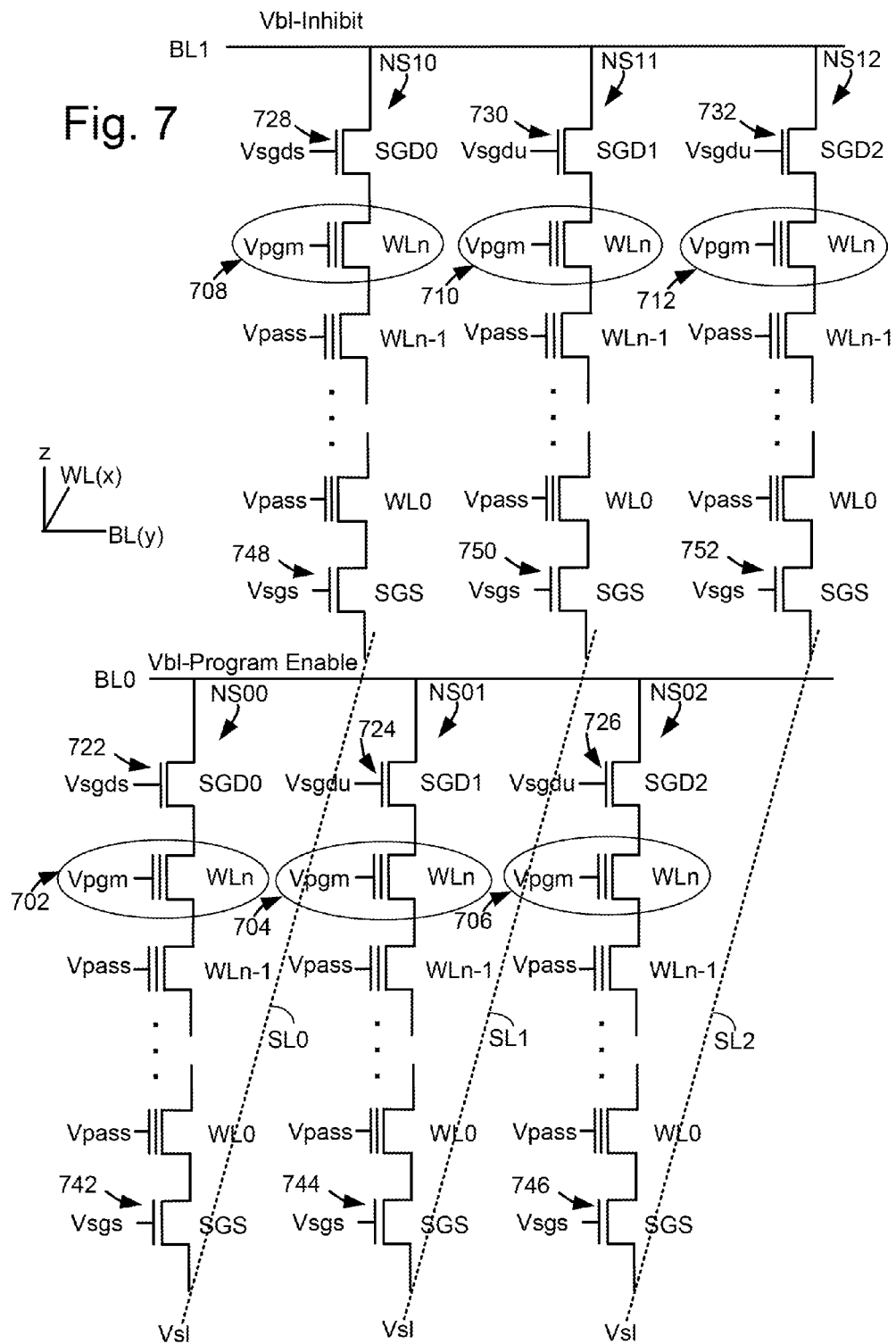

| Selected word line zone | Temperature compensation for control gate of unselected drain side select transistor |
|---|---|
| 3 | Highest |
| 2 | Medium |
| 1 | Lowest |
Fig. 14
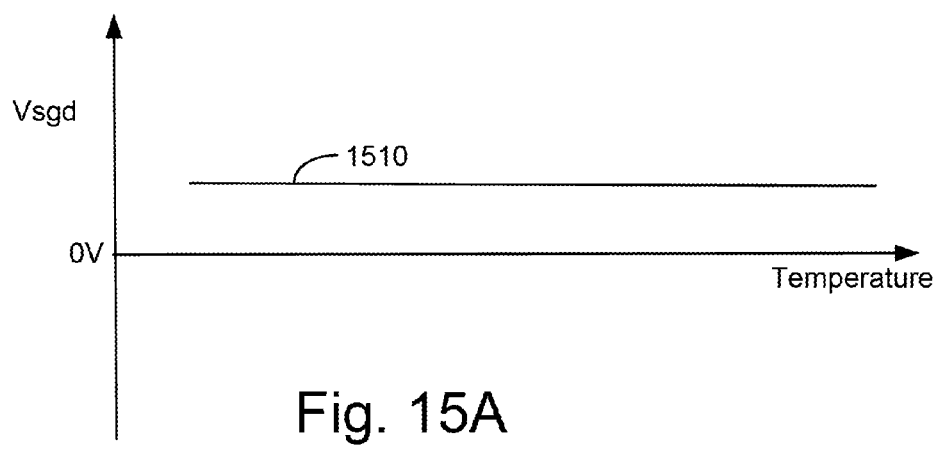
Fig. 15A
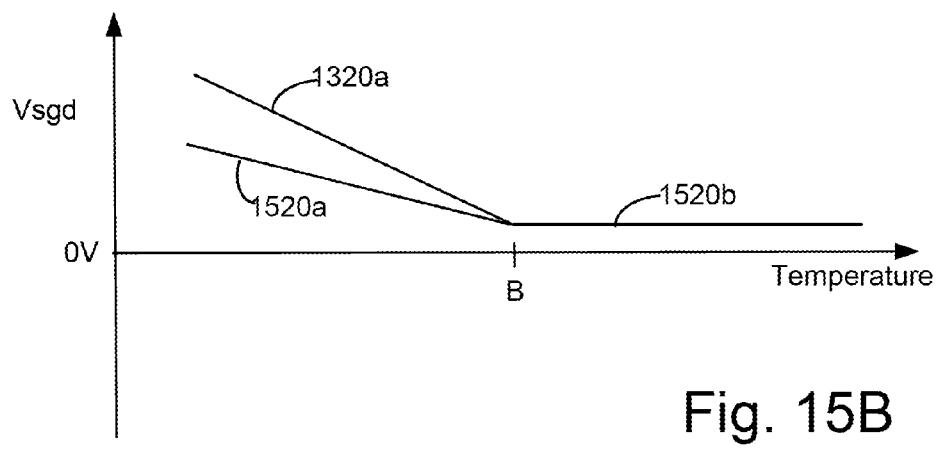
Fig. 15B

TEMPERATURE DEPENDENT VOLTAGE TO UNSELECTED DRAIN SIDE SELECT TRANSISTOR DURING PROGRAM OF 3D NAND

CLAIM OF PRIORITY

This application is a continuation of U.S. patent application Ser. No. 14/673,265, entitled "TEMPERATURE DEPENDENT VOLTAGE TO UNSELECTED DRAIN SIDE SELECT TRANSISTOR DURING PROGRAM OF 3D NAND," filed Mar. 30, 2015, issued as U.S. Pat. No. 9,245,642 on Jan. 26, 2016, and incorporated herein by reference in its entirety.

BACKGROUND

The present technology relates to operation of memory devices.

Semiconductor memory is commonly used in various electronic devices. For example, non-volatile semiconductor memory is used in personal navigation devices, cellular telephones, digital cameras, laptops and other devices. One type of memory uses a non-volatile charge storage region to store charges which represent a data state. The charge storage region may be a dielectric charge-trapping material. Another possibility is for the charge storage region to be a conductive floating gate. The charge-trapping material can be within memory cells on a NAND string in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 3A depicts an embodiment of block BLK0 of FIG. 1B which includes U-shaped NAND strings.

FIG. 4C depicts a cross-sectional view of a block of a 3D non-volatile memory device having straight strings.

FIG. 4D depicts a top view of an example word line layer of the block BLK0 of FIG. 1B, in a straight NAND string embodiment.

FIG. 4E depicts a top view of an example SGD layer 362, consistent with FIG. 4D.

FIG. 5A depicts a close-up view of the region 669 of the column C0 of FIG. 4C, showing a drain-side select transistor SGD0 and a memory cell MC6,0.

FIG. 5B depicts a cross-sectional view of the column C0 of FIG. 5A.

FIGS. 6A and 6B depict an alternative embodiment to that of FIGS. 5A and 5B.

FIG. 7 illustrates various types of program disturb in 3D NAND.

FIG. 14 depicts a table that illustrates one embodiment in which different temperature compensation schemes are used depending in which zone the selected word line is in.

FIGS. 15A and 15B shows graphs that depict how different temperature compensation might be applied depending on, for example, the word line zone.

DETAILED DESCRIPTION

Figure 1A:
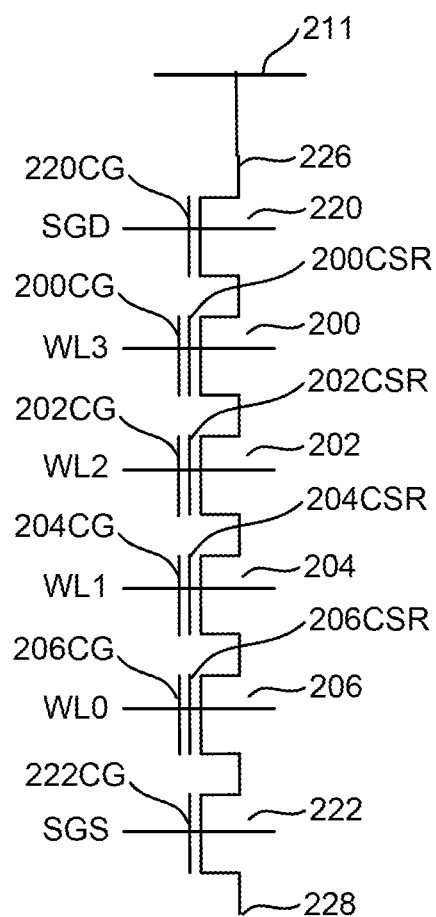
FIG. 1A is a circuit representation of a NAND string.

Techniques are provided for reducing program disturb in a memory device. The techniques include compensating for a temperature dependence of program disturb. The techniques may include compensating for how program disturb depends on the location of the word line that is selected for programming.

In one embodiment, the memory cells are part of a NAND string in a 3D memory device. Each NAND string is associated with a bit line. The NAND string has a drain side select transistor that connects/disconnects the NAND string to/from the bit line. At some times, the drain side select transistor should be on to connect the NAND string to the bit line to allow a bit line voltage to be passed to a channel of the NAND string. At some times, the drain side select transistor should be off to disconnect the NAND string from the bit line.

During programming, a NAND string that has a memory cell that is presently being programmed is referred to as a selected NAND string. If the NAND string does not have a memory cell that is presently being programmed it is referred to as an unselected NAND string. Each memory cell is associated with a word line. A programming voltage is applied to the word line that is associated with memory cells presently being programmed. This word line is referred to as the selected word line. However, there may be some memory cells associated with the selected word line that are to not undergo programming. A memory cell that is to not undergo programming is referred to as an unselected memory cell.

Program disturb may occur for unselected memory cells connected to the selected word line. The application of a program pulse to the selected word line can inadvertently program unselected memory cells. That is, the program pulse can inadvertently shift the threshold voltage of the unselected memory cells. One technique to reduce program disturb is to boost the potential of the NAND string channel of unselected NAND strings. However, if the channel boosting is not sufficient, then program disturb could happen. One possible reason for the channel boosting to not be sufficient is for the drain side select transistor to allow some of the charge in the channel to leak to the bit line, thereby reducing the boosted channel potential.

In one embodiment, the voltage that is applied to the gate terminal ("control gate") of drain side select transistors of unselected NAND strings is adjusted during programming based on temperature. This may reduce program disturb of memory cells that are not selected for programming.

In one embodiment, the voltage that is applied to the gate terminal of drain side select transistors of unselected NAND strings is adjusted during programming based on the location of the selected word line. This may reduce program disturb of memory cells that are not selected for programming.

In one embodiment, the voltage that is applied to the gate terminal of the drain side select transistors of unselected NAND strings is adjusted during programming based on both the temperature and the location of the selected word line. This may reduce program disturb of memory cells that are not selected for programming.

The following discussion provides details of the construction of example memory devices and of related techniques which address the above and other issues.

One example of a non-volatile storage system that can implement the technology described herein is a flash memory system that uses the NAND structure, which includes arranging multiple transistors in series, sandwiched between two select transistors. The transistors in series and the select transistors are referred to as a NAND string. FIG. 1A is a circuit representation of a NAND string. The NAND string depicted in FIG. 1A includes four transistors 200, 202, 204 and 206 in series and sandwiched between (drain side) select transistor 220 and (source side) select transistor 222. Select transistor 220 connects the NAND string to a bit line 211. Select transistor 222 connects the NAND string to source line 228. Select transistor 220 is controlled by applying the appropriate voltages to select line SGD. Select transistor 222 is controlled by applying the appropriate voltages to select line SGS.

Each of the transistors 200, 202, 204 and 206 has a control gate (CG) and a charge storage region (CSR). For example, transistor 200 has control gate 200CG charge storage region 200CSR. Transistor 202 includes control gate 202CG and a charge storage region 202CSR. Transistor 204 includes control gate 204CG and charge storage region 204CSR. Transistor 206 includes a control gate 206CG and a charge storage region 206CSR. Control gate 200CG is connected to word line WL3, control gate 202CG is connected to word line WL2, control gate 204CG is connected to word line WL1, and control gate 206CG is connected to word line WL0.

Note that although FIG. 1A shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of silicon oxide, silicon nitride and silicon oxide ("ONO") is sandwiched between a conductive control gate and the memory cell channel. For example, the ONO may be $Al_2O_3$—SiN—$SiO_2$. In the direction from the control gate toward the NAND channel, the first oxide (e.g., $Al_2O_3$) is a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the columns may extend in the z direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

Figure 1B:
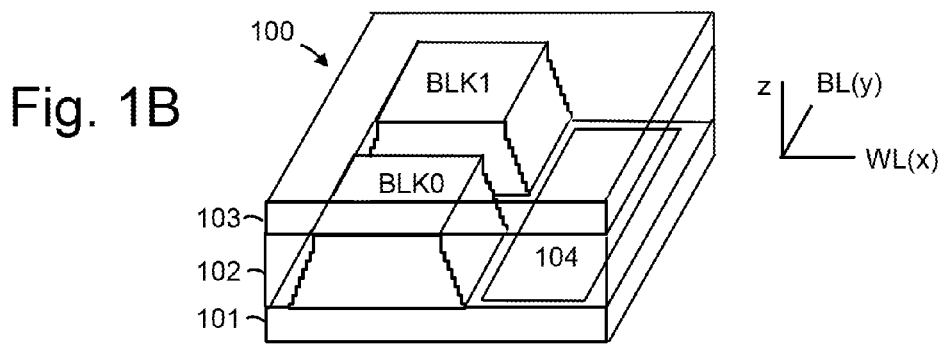
FIG. 1B is a perspective view of a 3D stacked non-volatile memory device.

FIG. 1B is a perspective view of a 3D stacked non-volatile memory device. The memory device 100 includes a substrate 101. The substrate 101 is a semiconductor substrate, in one embodiment. For example, the substrate 101 may be a silicon substrate. In one embodiment, substrate 101 is formed from a semiconductor wafer. The substrate 101 has at least one major axis that extends in a horizontal direction. For example, the x-axis and y-axis extend in the horizontal direction. The substrate 101 has a major surface that is parallel to the x-y plane.

On the substrate 101 are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 1C:
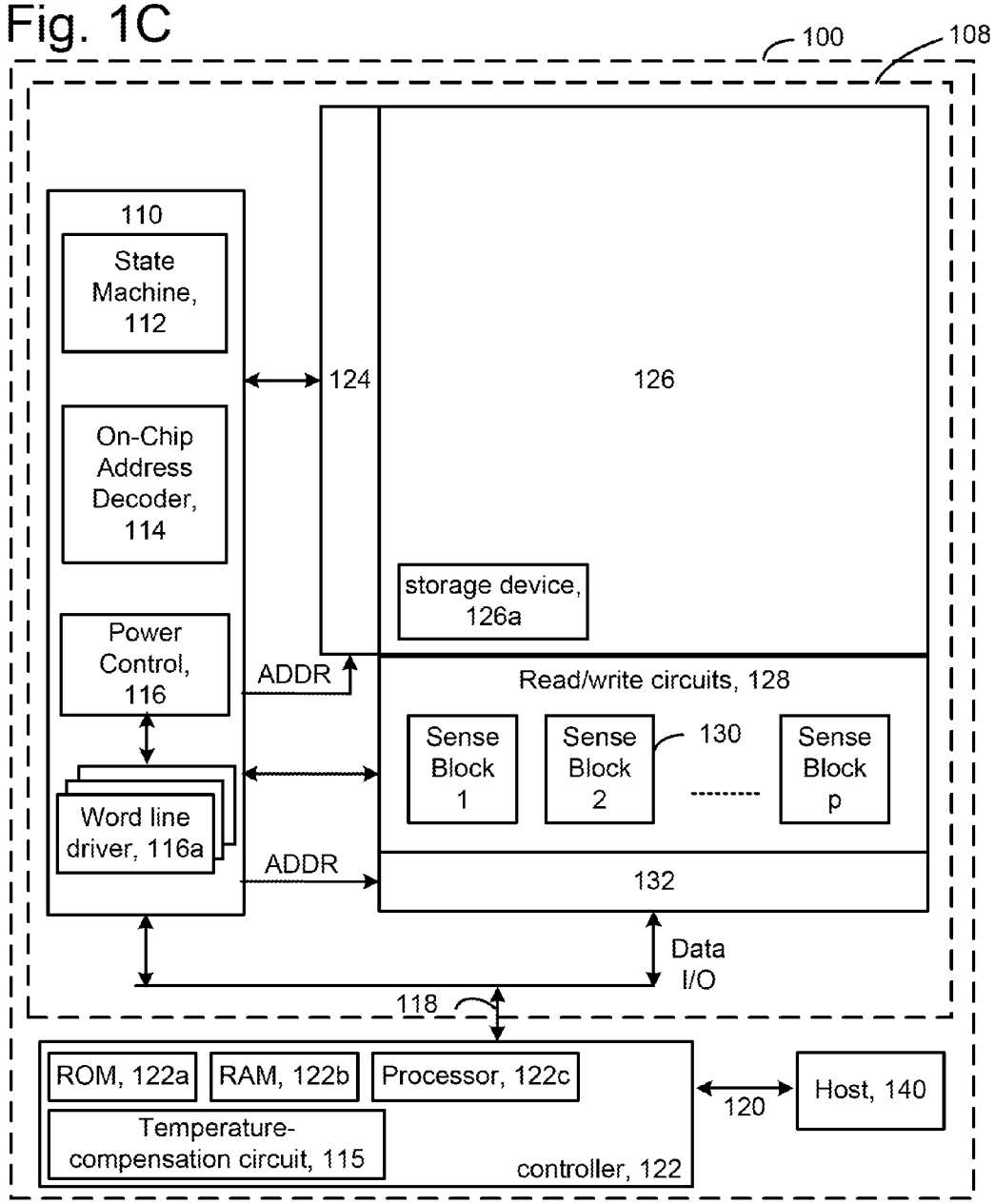
FIG. 1C is a functional block diagram of a memory device such as the 3D stacked non-volatile memory device of FIG. 1B.

FIG. 1C is a functional block diagram of a memory device such as the 3D stacked non-volatile memory device 100 of FIG. 1B. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1B. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word lines, SGS and SGD transistors and source lines. An example set of word line drivers including a word line driver 116a is depicted. The sense blocks 130 can include bit line drivers, in one approach. An SGS transistor is a select transistor at a source end of a NAND string, and an SGD transistor is a select transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128 and controller 122 (including processor 122c and temperature-compensation circuit 115), and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

The controller 122 may also include a temperature-compensation circuit 115 which is used by the processor 122c to set temperature-based parameters such as a voltage applied to a control gate of a drain side select transistor. For example, the controller may provide a digital signal to the power control module 116 to set a voltage magnitude in response to the temperature-compensation circuit.

Figure 1D:
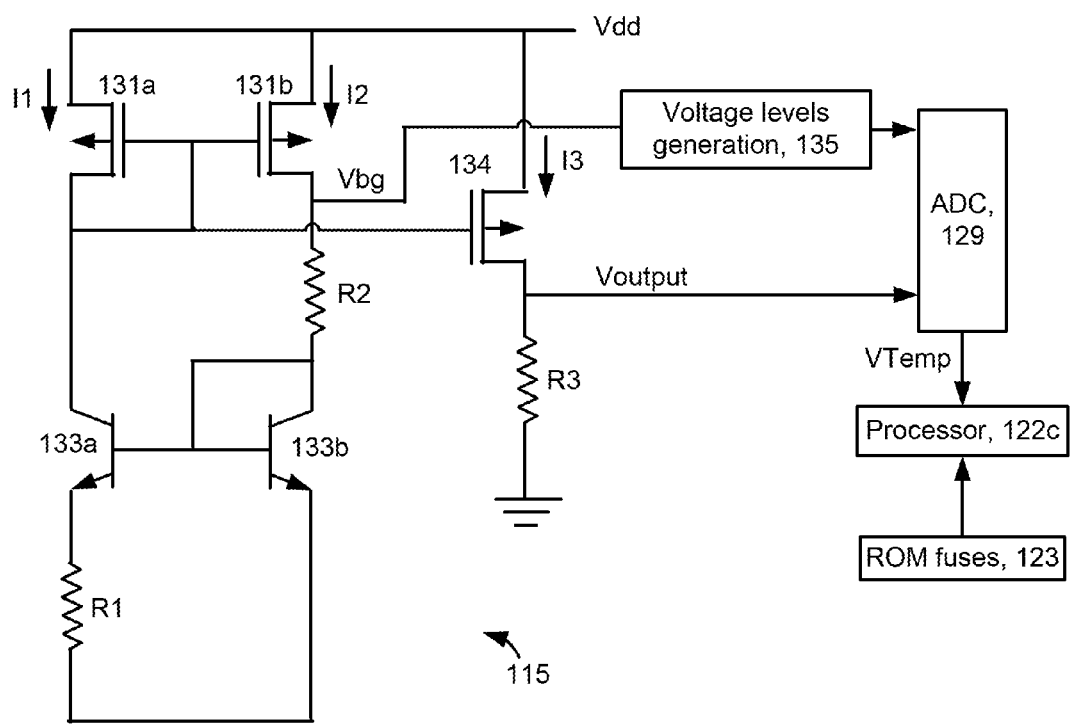
FIG. 1D depicts an example of the temperature-sensing circuit 115 of FIG. 1C.

FIG. 1D depicts an example of the temperature-sensing circuit 115 of FIG. 1C. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
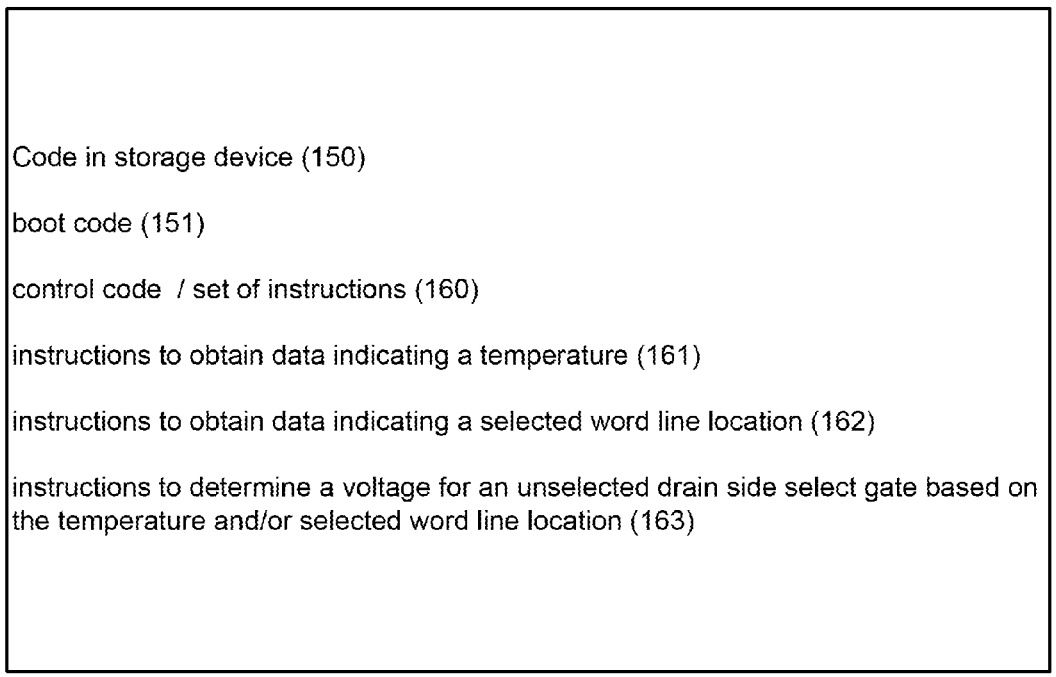
FIG. 2 depicts code which may be executed by a processor.

FIG. 2 depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instructions to obtain data indicating a temperature (161), instructions to obtain data indicating a location of a selected word line during a program operation (162), and instructions to determine a voltage for control gates of unselected drain side select transistors based on the temperature and/or selected word line location (163).

Figure 10:
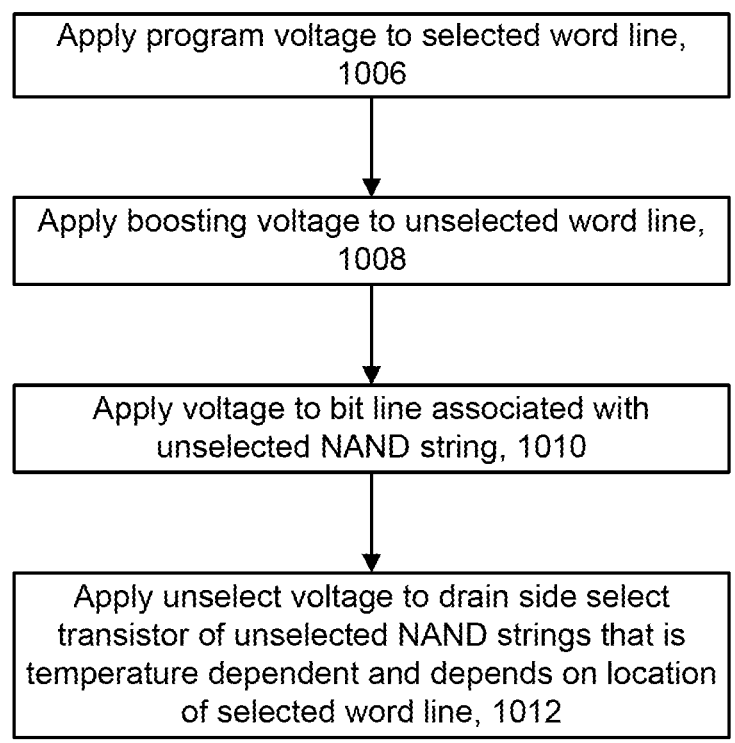
FIG. 10 depicts an example temperature-based programming operation.
Figure 11:
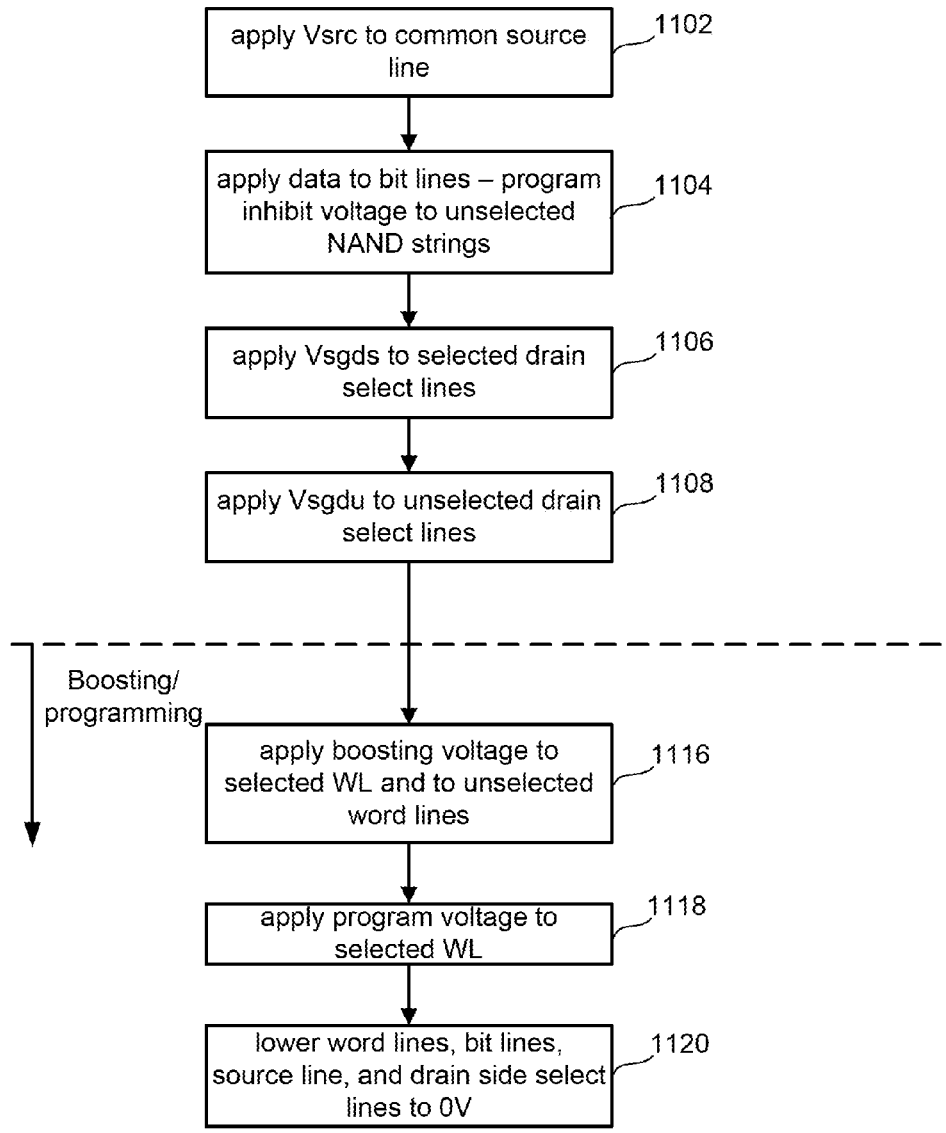
FIG. 11 is a flowchart of one embodiment details of programming non-volatile storage.

The control code can include instructions to perform the functions described herein including the steps of the processes of FIGS. 10 and 11.

In one embodiment, NAND strings have a U-shape. In another embodiment, NAND strings have a straight shape. FIG. 3A depicts an embodiment of block BLK0 of FIG. 1B which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select transistor that is able to connect/disconnect the NAND string from its bit line. The drain side select transistors in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0-0 (having drain-side column C0 and source-side column C1), NSA0-1 (having drain-side column C3 and source-side column C2), NSA0-2 (having drain-side column C4 and source-side column C5), NSA3-0 (having drain-side column C7 and source-side column C6), NSA0-4 (having drain-side column C8 and source-side column C9) and NSA0-5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
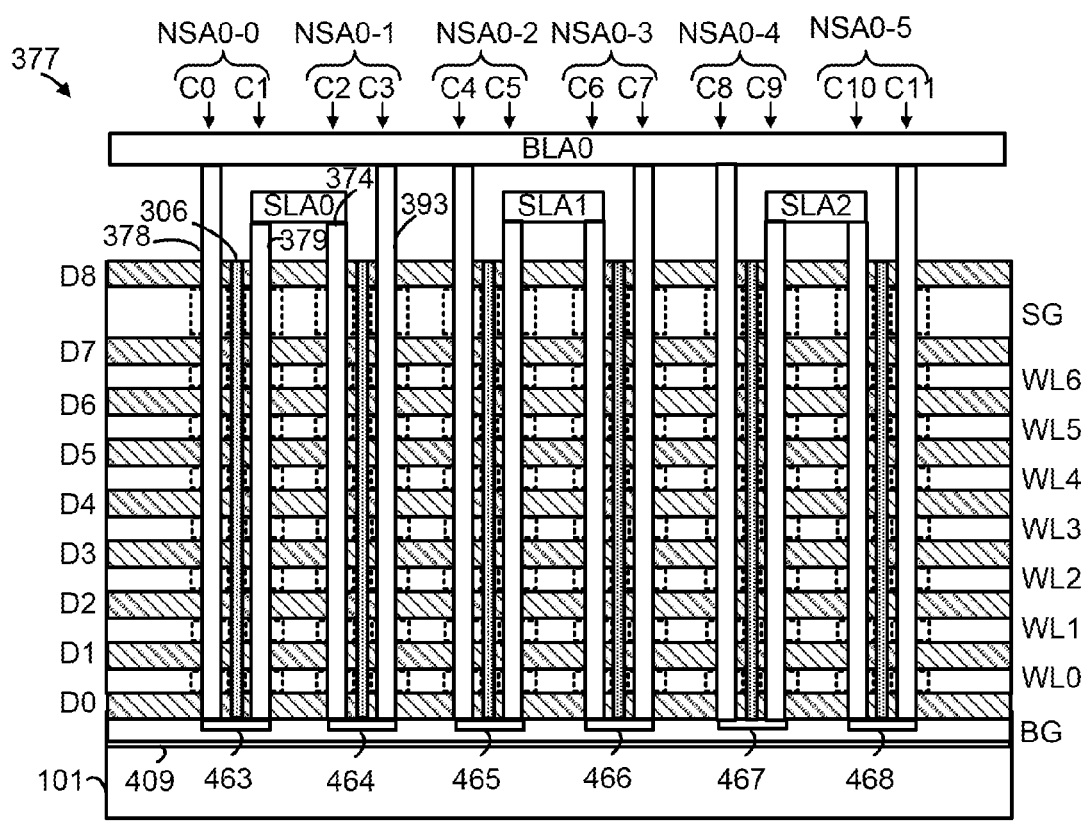
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 101, an insulating film 409 on the substrate 101, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0-0 includes columns C0 and C1 and connecting portion 463. NSA0-0 has a drain end 378 and a source end 379. NSA0-1 includes columns C2 and C3 and connecting portion 464. NSA0-1 has a drain end 393 and a source end 374. NSA0-2 includes columns C4 and C5 and connecting portion 665. NSA0-3 includes columns C6 and C7 and connecting portion 466. NSA0-4 includes columns C8 and C9 and connecting portion 467. NSA0-5 includes columns C10 and C11 and connecting portion 468.

The source line SLA0 is connected to the source ends 379 and 374 of two adjacent memory strings NSA0-0 and NSA0-1, respectively, in the SetA0 of memory strings. The source line SLA0 is also connected to other sets of memory strings which are behind NSA0-0 and NSA0-1 in the x direction. Recall that additional U-shaped NAND strings in the stack 377 extend behind the U-shaped NAND strings depicted in the cross-section, e.g., along the x-axis. The U-shaped NAND strings NSA0-0 to NSA0-5 are each in a different sub-block, but are in a common set of NAND strings (SetA0).

A slit portion 306 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select transistors, as discussed further below. Thus, FIG. 3B shows strings (e.g., NAND strings) of non-volatile storage elements formed above the substrate 101 in multiple physical levels of a three-dimensional memory array. Each of the strings has an active area comprising a channel that extends vertically through the physical levels. Each string comprises non-volatile storage elements and a drain side select transistor in the SG layer.

Figures 3C, 3D:
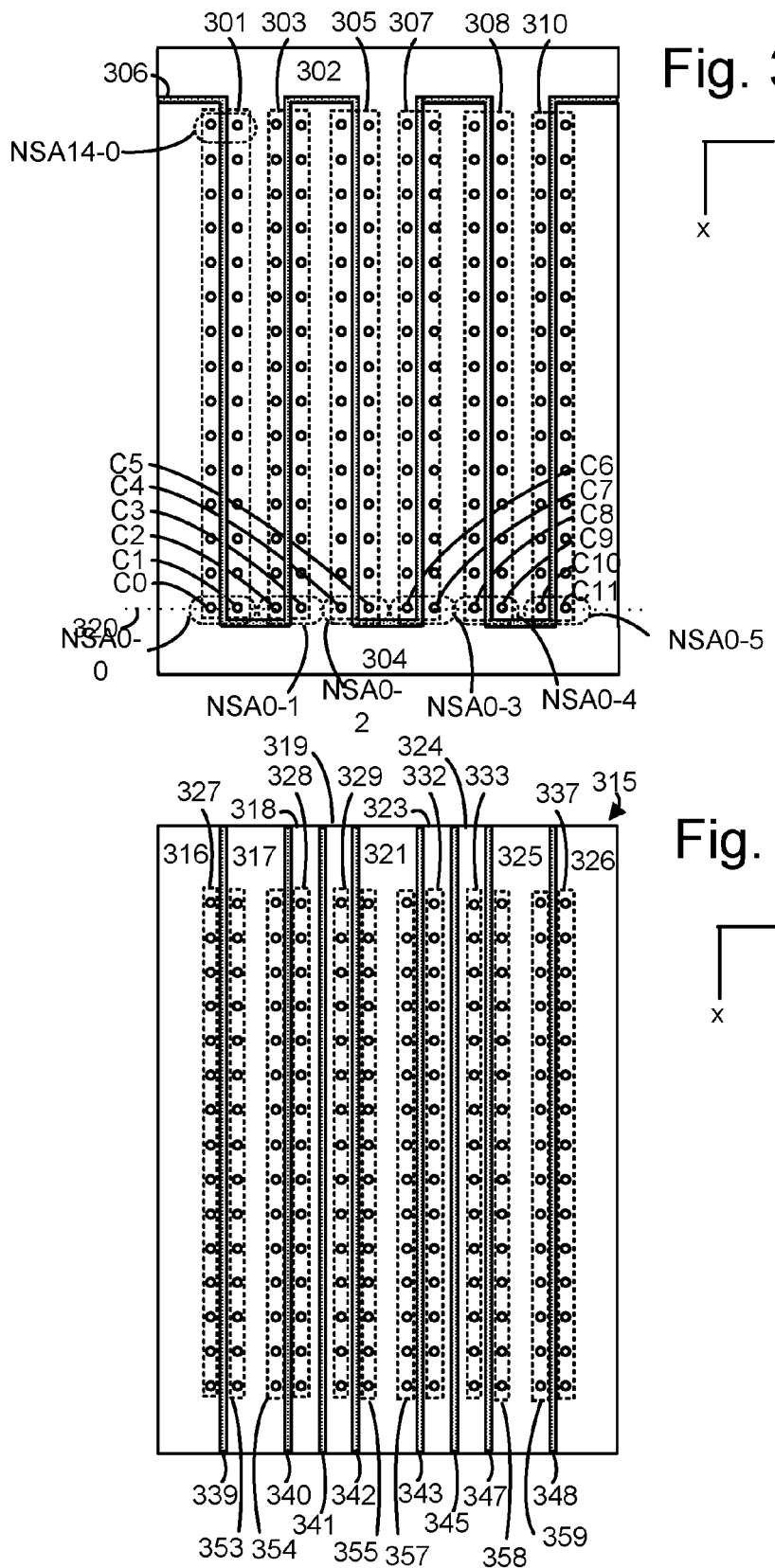
FIG. 3C depicts a top view of example word line layers in a U-shaped NAND embodiment.
FIG. 3D depicts a top view of example select transistor layer portions, consistent with FIG. 3C.

FIG. 3C depicts a top view of example word line layers 302 and 304 in a U-shaped NAND embodiment, as an example implementation in FIG. 3B. In a 3D stacked memory device, memory cells are formed along memory holes which extend through alternating conductive and dielectric layers in a stack. The memory cells are typically arranged in NAND strings. Each conductive layer can include one or more word line layers. A word line layer (WLL) is an example of a word line.

The view is of a representative layer among the multiple WLLs in a stack. Referring also to FIG. 3B, the stack 377 includes alternating dielectric and conductive layers. The dielectric layers include DL0 to DL8 and may be made of $SiO_2$, for instance. The conductive layers include a back gate layer (BG), data-storing word line layers WL0 to WL6, and select transistor layer SG. There could be many more word line layers. There could also be dummy word line layers, which contain memory cells that do not store data (not depicted in FIG. 3B). There could be multiple select transistor layers at the top of the stack 377. The word line layers are conductive paths to control gates of the memory cells at the layer. Moreover, each select transistor layer may comprise conductive lines to select transistors.

The word line layers 302, 304 of FIG. 3C may represent any one of the word line layers in FIG. 3B. These conductive layers 302, 304 may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 302 and 304 which are insulated from one another by a slit 306. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 306 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 320 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. Regions 301, 303, 305, 307, 308 and 310 each represent a set of NAND strings, or a set of memory cells in a word line layer. For example, region 310 includes NAND strings NSA0-5, . . . , NSA14-5. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32$k$ memory columns in the x direction, for a total of 384,000 memory columns in a block. With U-shaped NAND strings, 192$k$ NAND strings are provided in this example. With straight NAND strings, 384,000 NAND strings are provided in this example. Assuming there are twenty-four memory cells per column, there are 384,000×24=9,216,000 memory cells in the set.

FIG. 3D depicts a top view of example select transistor layer portions, consistent with FIG. 3C. This is for the same NAND strings as shown in FIG. 3C. In one approach, the select transistor layer 315 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 339, 340, 341, 342, 343, 345, 347 and 348. The slits extend partway down in the stack as depicted by example slit 341 in FIG. 3D. Regions 327, 328, 329, 332, 333 and 337 represent SGD transistors in SGD lines 316, 318, 319, 323, 324 and 326, respectively. Regions 353 and 354, 355 and 357, and 358 and 359 represent SGS transistors in SGS lines 317, 321 and 325, respectively. Regions 355 and 357, 358 and 359, represent SGS transistors in SGS layer portions 321 and 325, respectively.

Figure 4A:
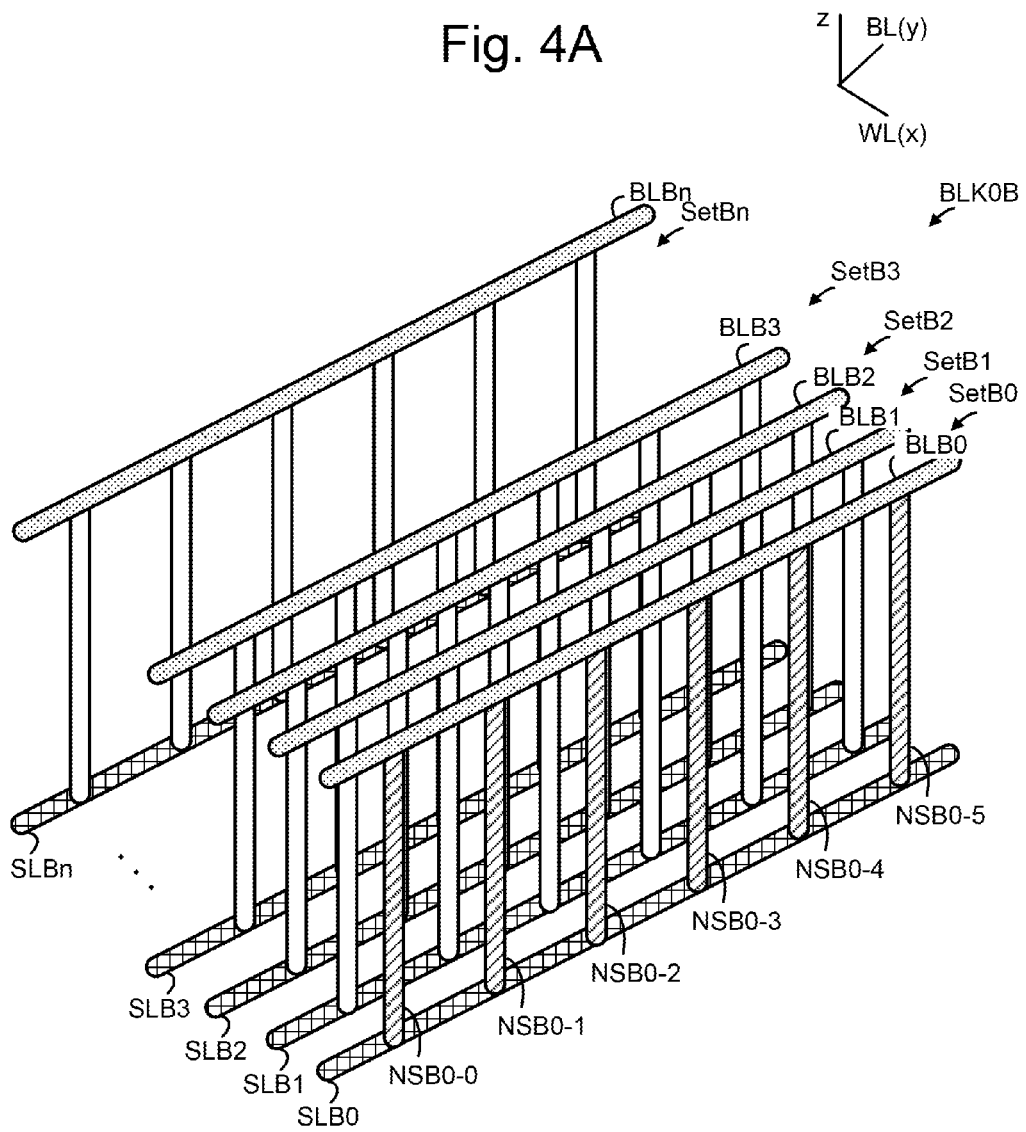
FIG. 4A depicts an embodiment of block BLK0 of FIG. 2 which includes straight NAND strings.

FIG. 4A depicts an embodiment of block BLK0 of FIG. 1B which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetB0 includes NAND strings NSB0-0, NSB0-1, NSB0-2, NSB0-3, NSB0-4 and NSB0-5. Source lines extend parallel to the bit line in this example and include SLB0, SLB1, SLB2, SLB3, . . . , SLBn. It is not required for the source lines to extend parallel to the bit line. The source lines extend perpendicular to the bit lines in another example. In one approach, the source lines in a block are joined to one another and driven by one driver. The bit lines are above the memory cell array and the source lines are below the memory cell array in this example.

Figure 4B:
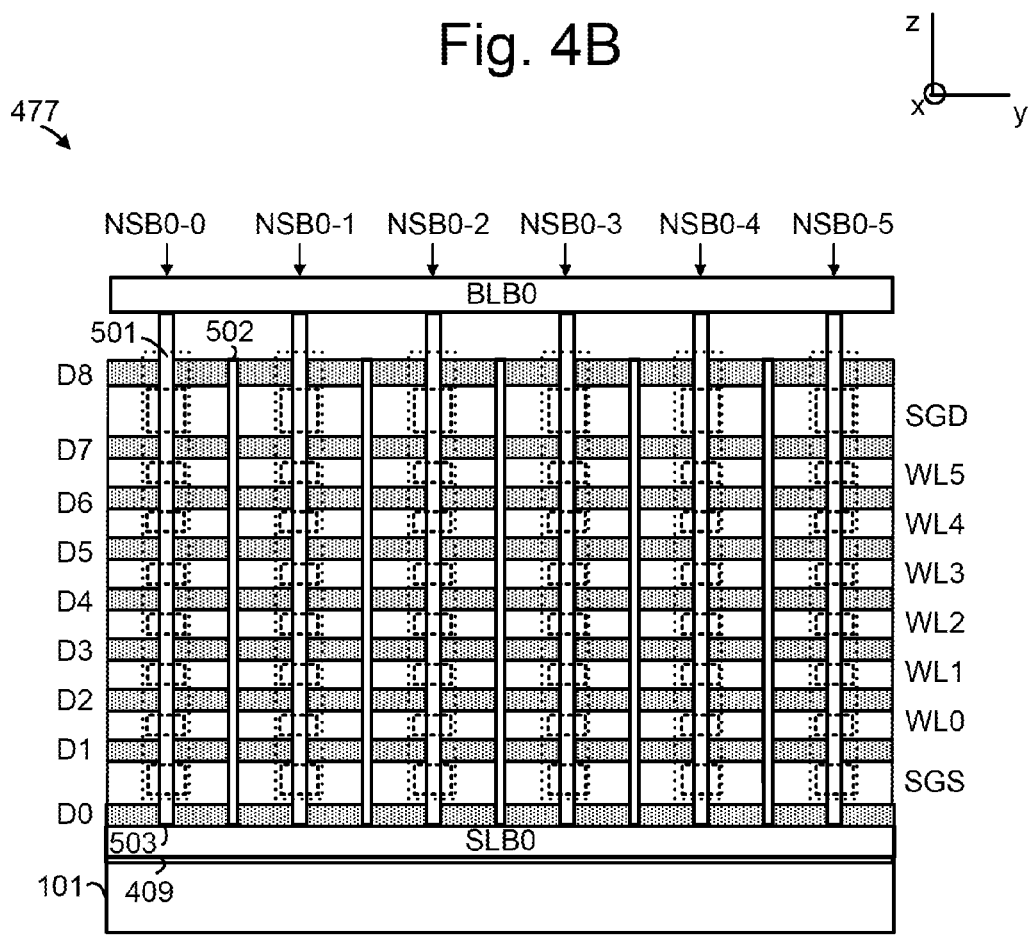
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0-0 to NSB0-5, respectively, are depicted in the multi-layer stack. The stack 477 includes a substrate 101, an insulating film 409 on the substrate, and a portion of a source line SLB0. Additional straight NAND strings in a sub-block may extend in front of and in back of the NAND strings depicted in the cross-section, e.g., along the x-axis. The NAND strings NSB0-0 to NSB0-5 may each be in a different sub-block, but are in a common set of NAND strings (SetB0). NSB0-0 has a source end 503 and a drain end 501. A slit 502 is also depicted with other slits. It is not required that there be a slit 502 between each pair of strings, as depicted. For example, slits could be used to separate blocks. Slits could be placed between several groups of strings within a block. In this case, a group of strings separated by slits within a block may be referred to as a "finger". There may be several fingers within a block. A portion of the bit line BLB0 is also depicted. Dashed lines depict memory cells and select transistors, as discussed further below.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the semiconductor substrate 101. The semiconductor substrate 101 may be silicon. The source line is not depicted in FIG. 4C. A region 669 of the stack that includes column CB0 is shown in greater detail in FIG. 5A.

FIG. 4D depicts a top view of an example word line layer 404 of the block BLK0 of FIG. 1B, in a straight NAND string embodiment. In this configuration, a NAND string has only one column, and the source-side select transistor is on the bottom of the column instead of on the top, as in a U-shaped NAND string. Moreover, a given level of a block has one WLL which is connected to each of the memory cells of the layer. Insulation-filled slits 446, 447, 448, 449 and 450 can also be used in the fabrication process to provide structural support for the stack when undoped polysilicon layers are removed by a wet etch and a dielectric is deposited to form the alternating dielectric layers.

Regions 440, 441, 442, 443, 444 and 445 represent the memory cells (as circles) of respective sets of NAND strings. For example, region 440 represents memory cells in NAND strings NSB0-0, . . . , NSB14-0. Additional labeled NAND strings include NSB0-1, NSB0-2, NSB0-3, NSB0-4 and NSB0-5.

Alternatively, the layer 404 represents an SGS layer, in which case each circle represents an SGS transistor.

FIG. 4E depicts a top view of an example SGD layer 462, consistent with FIG. 4D. Slits 457, 458, 459, 460 and 461 divide the SGD layer into portions 463, 464, 465, 466, 467 and 468. Each portion connects the SGD transistors in a set of NAND strings. For example, SGD layer portion 463 or line connects the SGD transistors in the set of NAND strings NSB0-0 to NSB14-0. Regions 451, 452, 453, 454, 455 and 456 represent the SGD transistors (as circles) of respective sets of NAND strings in the SGD layer portions 463, 464, 465, 466, 467 and 468, respectively. The select transistors are associated with NAND strings NS0A-NS5A.

FIG. 5A depicts a close-up view of region 669, which includes column CB0 of FIG. 4C, showing a drain-side select transistor SGD0 and a memory cell MC6,0. FIG. 5B depicts a cross-sectional view of the column CB0 of FIG. 5A. The region 669 shows portions of the dielectric layers D6 to D8 and the conductive layers WL6 and SGD. Note what is labeled SGD in FIG. 5A corresponds to SGD layer portion 463 in FIG. 4E. Each column includes a number of layers. These layers can include oxide-nitride-oxide and silicon layers which may be formed using a variety of techniques.

A variety of techniques could be used to form the layers. One technique is to drill memory holes into horizontal layers of some material and then fill those memory holes. Note that the memory holes are not necessarily drilled into the horizontal material depicted in FIG. 5A. One option is to first have a sacrificial material instead of the conductive layers WL6 and SGD. After drilling the memory holes and filling the memory holes to form the column, the sacrificial material can be replaced with conductive material for WL6 and SGD. Some of the layers might be formed using atomic layer deposition. For example, a block oxide (or blocking layer) can be deposited on vertical sidewalls of the memory hole as layer 696, a nitride such as SiN as a charge trapping layer (e.g., charge storage region CSR) can be deposited as layer 697, and a tunnel dielectric (or tunneling layer) can be deposited as layer 698. It is not required that all of these layers be formed in the column. An example is discussed below in FIG. 6A in which the blocking layer is not a part of the column.

The block oxide layer 696 and the tunnel dielectric layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel dielectric layer 698 comprises a stack of oxide, nitride and oxide films. Additional memory cells are similarly formed throughout the columns.

The NAND channel 699 may be formed from a variety of semiconductor materials. In one embodiment, the channel 699 is silicon. However, a different semiconductor could be used. There is a core 695 region in the middle. The core 695 is silicon oxide, in one embodiment. The core 695 is not a requirement, but its presence can simplify device fabrication for some embodiments.

When a memory cell such as depicted in FIG. 5A is programmed, electrons are stored in a portion of the charge trapping layer which is associated with the memory cell. For example, electrons are represented by "−" symbols in the charge trapping layer 697 for MC6,0 in FIG. 5A. These electrons are drawn into the charge trapping layer from the semiconductor body, and through the tunnel oxide. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and bias to the gate of the drain side select transistor, and similarly, between source line bias and a gate of the source side select transistor. The voltage of the one or more selected word line layers is then driven down sharply to a low level such as 0 V to create an electric field across the tunnel dielectric which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel dielectric is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

FIGS. 6A and 6B depict an alternative embodiment to that of FIGS. 5A and 5B. FIG. 6A shows similar layers D6, WL6, D7, SGD, and D8, as were depicted in FIG. 5A. A memory cell MC6,0 and a drain side elect gate SGD0, are shown. Note that in this embodiment, the column CB0 has charge trapping layer 697, tunnel dielectric layer 698, channel 699, and core 695. However, in the embodiment of FIGS. 6A and 6B, the blocking layer 696 is located outside of the column CB0. The blocking layer 696 has a portion that is in direct contact with charge trapping layer 697. The blocking layer 696 has an optional portion above and below the word line 605. This optional portion results from one embodiment of the fabrication process in which after forming the column, sacrificial material is removed where the word line and blocking layer are to be formed. Then, the blocking layer 696 is deposited, followed by depositing the word line 605. FIG. 6B shows a cross section of FIG. 6A along line 607.

Other types of non-volatile memory in addition to NAND flash memory can also be used.

FIG. 7 illustrates various types of program disturb in 3D NAND. The diagram shows several vertical NAND strings NS00, NS01, NS02, NS10, NS11, NS12. In this example, the NAND strings are straight. However, program disturb also affects U-shaped NAND strings. Three of the NAND strings (NS00, NS01, NS02) are associated with bit line BL0. Three of the NAND strings (NS10, NS11, NS12) are associated with bit line BL1. Each NAND string has a drain side select transistor (722, 724, 726, 728, 730, 732) with a terminal connected to the bit line associated with that NAND string.

The NAND strings are associated with three different drain side select lines SGD0, SGD1, SGD2. The select lines are not shown in FIG. 7 so as to not obscure the diagram. However, the reference SGD0, SGD1, SGD2 are depicted next to the drain side select transistors to show which select line is associated with each transistor. The drain side select lines SGD0, SGD1, SGD2 may correspond to the SGD layer portions 463, 464, 465 depicted in FIG. 4E.

The drain side select transistors (722, 728) of NAND strings NS00 and NS10 each have their gate terminal connected to drain side select line SGD0. The drain side select transistors (724, 730) of NAND strings NS01 and NS11 each have their gate terminal connected to drain side select line SGD1. The drain side select transistors (726, 732) of NAND strings NS02 and NS12 each have their gate terminal connected to drain side select line SGD2.

Each NAND string also has a source side select transistor (742, 744, 746, 748, 750, 752) that is at the opposite end of the NAND string as the drain side select transistor. Each source side select transistor has a terminal connected to a source line. In this example, NAND strings NS00 and NS10 each have a terminal connected to source line SL0, NAND strings NS01 and NS11 each have a terminal connected to source line SL1, and NAND strings NS02 and NS12 each have a terminal connected to source line SL2. The gate of each of the source side select transistors (742, 744, 746, 748, 750, 752) is connected to a source select line (SGS).

Each NAND string is associated with word lines WL0-WLn. The word lines are not depicted in FIG. 7. However, the references WL0, WLn−1, and WLn are shown next to various memory cells to indicate the word line that is associated with that memory cell. An example of a word line layer for straight NAND strings is depicted in FIG. 4D. The word line is either connected or serves as the control gate of its associated memory cell. In other words, the portion of the word line that is adjacent to the memory cell may serve as the control gate. Therefore, a voltage such as Vpass or Vpgm may be applied to the control gate of the respective memory cells via the word line. Memory cells 702, 704, 706, 708, 710, and 712 are each associated with the same word line. Thus, if one of the memory cells in that group is being programmed, all of the memory cells in that group will receive Vpgm on its control gate even if it is not being programmed at that time.

In the example, memory cell 702 is selected for programming. However, none of the other memory cells depicted in FIG. 7 is currently selected for programming, in this example. Vpgm is applied to the control gate of memory cell 702 by applying Vpgm to word line WLn. A program enable voltage is applied to the bit line (BL0) associated with the selected memory cell 702. The voltage Vsgds that is applied to the drain side select transistor 722 of NAND string NS00 turns on the drain side select transistor 722 such that the program enable voltage is passed to the channel of NAND string NS00. As one example, Vbl Program Enable can be about 0V. Therefore, Vsgds can be at about the threshold voltage of the drain side select transistor, or a little higher, to turn on that drain side select transistor. This connects bit line BL0 to the channel of the selected NAND string NS00. Therefore, the bit line voltage may be passed to the channel of the selected NAND string NS00.

Because drain side select line SGD0 is also connected to the gate terminal of the drain side select transistor 728 of NAND string NS10, the voltage Vsgds is also applied to drain side select transistor 728. However, a program inhibit voltage (Vbl_Inhibit) is being applied to the bit line (BL1) associated with NAND string NS10. The combination of Vsgds and Vbl_Inhibit should not turn on drain side select transistor 728 of NAND string NS10. Vbl_Inhibit is typically slightly greater than Vbl_Program_Enable. Therefore, the drain side select transistor 728 is under-driven. Therefore, NAND string NS10 is cut off from its bit line BL1. Furthermore, the channel of NAND string NS10 has its channel potential boosted during programming. The boosting of the channel potential may be achieved by applying boosting voltages (Vpass) to unselected word lines. In this example, word lines WL0-WLn−1 are unselected. The boosting of the channel reduces the voltage difference between the control gate and channel of unselected memory cells. Thus, even though memory cell 708 has Vpgm applied to its control gate, it does not program due to the boosted channel potential.

However, a program disturb effect is possible for memory cell 708. One possible cause of program disturb is when the boosting of the channel potential of NAND string NS10 is not sufficient. A variety of factors could reduce the boosted channel potential of a NAND string that is not selected for programming. One possible factor is for the channel potential to not reach the desired boosting potential in the first place. Another possible factor is leakage of the channel potential via the drain side select transistor 728 to the bit line BL1. One possible cause of leakage is "sub-threshold" leakage through the drain side select transistor to the bit line. Sub-threshold leakage may be a greater problem just below the transistor's threshold voltage. Another possible cause of leakage is gate induced drain leakage (GIDL) through the drain side select transistor to the bit line. As the select transistor is over-driven by a greater amount, GIDL tends to become more severe. The program disturb to memory cell 708 (when memory cell 702 is being programmed) may be referred to as "x-disturb".

Memory cells 704, 706, 710, and 712 may also be subject to program disturb when memory cell 702 is being programmed. The program disturb to memory cells 704 and 706 (when memory cell 702 is being programmed) may be referred to as "y-disturb". The program disturb to memory cells 710 and 712 (when memory cell 702 is being programmed) may be referred to as "xy-disturb".

First, the y-disturb case will be discussed. NAND strings NS01 and NS02 are each associated with bit line BL0, which has been selected for programming. Therefore, the Vbl_Program_Enable is being applied to the bit lines associated with NAND strings NS01 and NS02. However, memory cells 704 and 706 are not presently selected for programming. Since the drain side select transistor 724 of NAND string NS01 is connected to drain side select line SGD1 it receives an "unselect voltage" Vsgdu. This voltage should keep the drain side select transistor 724 off despite the program enable voltage being applied to the bit line. An example of Vsgdu is about 0V. Since, Vbl_Program_Enable is also about 0V in this example, the drain side select transistor 724 should not turn on. Therefore, the unselected NAND string NS01 is cut off from bit line BL0. Thus, the boosting voltages Vpass applied to unselected word lines can boost the channel potential of NAND string NS01. Thus, unintended programming of memory cell 704 may be prevented. Similar reasoning applied to memory cell 706 on NAND string NS02.

However, a "y-mode" program disturb effect is possible for memory cells 704 and 706. As noted above, a possible cause of program disturb is when the boosting of the channel potential of NAND string is not sufficient. As noted above, a variety of factors could reduce the boosted channel potential of a NAND string that is not selected for programming. The factors for y-mode program disturb are not necessarily the same for x-mode program disturb.

Next, the xy-disturb case will be discussed. NAND strings NS11 and NS12 are each associated with bit line BL1, which has not been selected for programming. Therefore, the program inhibit voltage is being applied to the bit lines associated with NAND strings NS11 and NS12. Moreover, since the drain side select transistor 730 of NAND string NS11 is connected to drain side select line SGD1 it receives the "unselect voltage" Vsgdu, as discussed above with respect to unselected NAND string NS01. This voltage keeps the drain side select transistor 730 off. In the present example, Vsgdu is 0V and Vbl_Inhibit is slighter higher than 0V (e.g., about 2V). Therefore, drain side select transistors 730 and 732 are under-driven and stay off. Consequently, NAND strings NS11 and NS12 are cut off from but line BL1._Thus, the boosting voltages Vpass applied to unselected word lines can boost the channel potential of NAND strings NS11 and NS12. Thus, unintended programming of memory cells 710 and 712 may be prevented.

However, an "xy-mode" program disturb effect is possible for memory cells 710 and 712. As noted above, a possible cause of program disturb is when the boosting of the channel potential of a NAND string is not sufficient. As noted above, a variety of factors could reduce the boosted channel potential of a NAND string that is not selected for programming. The factors for xy-mode program disturb are not necessarily the same for x-mode program disturb or for y-mode program disturb.

Figure 8:
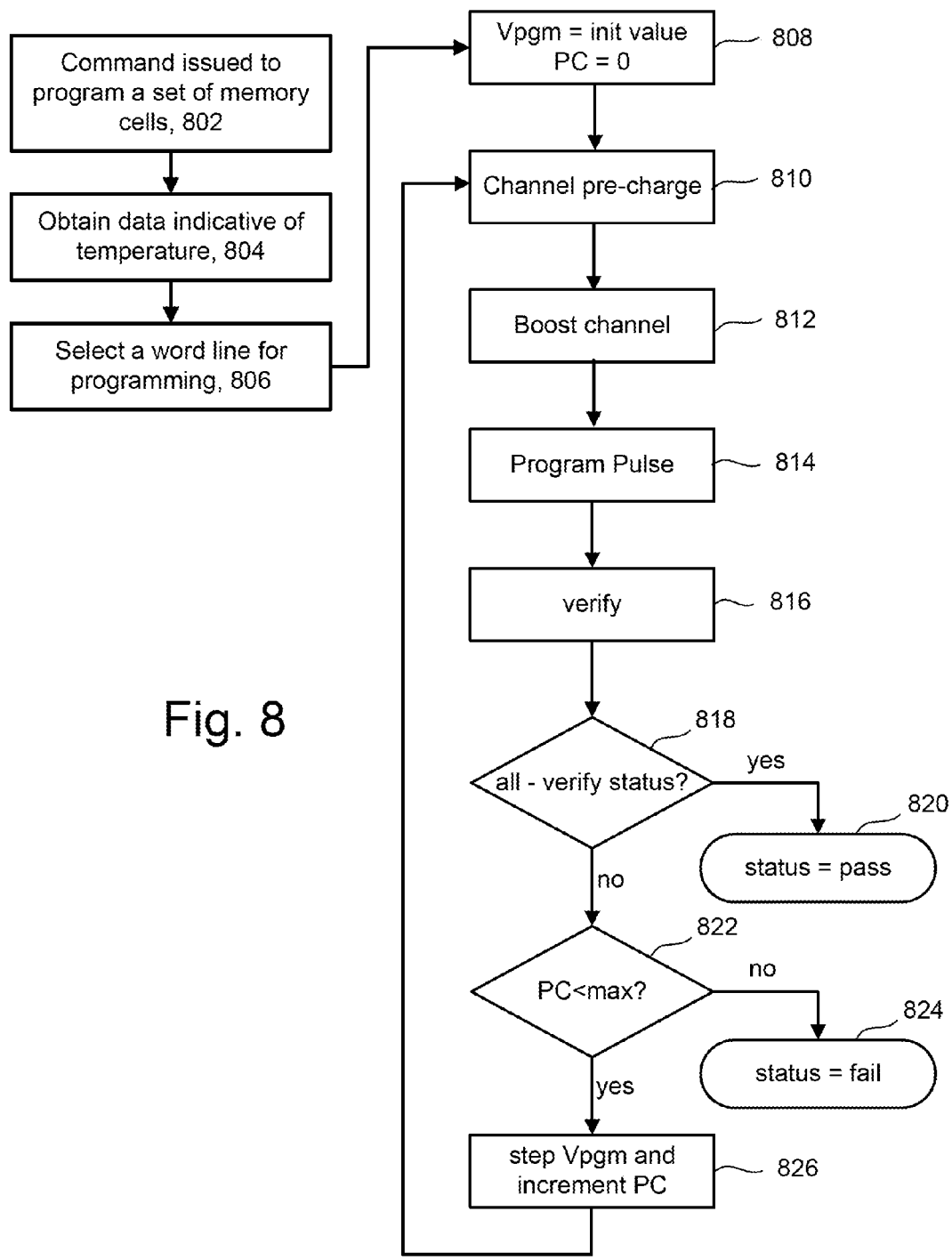
FIG. 8 is a flowchart describing one embodiment of a programming process.

Prior to discussing program disturb in further detail, programming of the memory cells will be discussed. FIG. 8 is a flowchart describing one embodiment of a programming process. Note that the steps are not necessarily performed on the depicted order. At step 802, a command is issued to program data into a set of memory cells. For example, a controller may provide such a command in response to a command from a host device to store data. Prior to the command to program data, the memory cells in a block may be erased. Step 804 includes obtaining data indicating temperature, such as discussed in connection with FIG. 1C.

Step 806 includes selecting a word line for programming. In some cases, data is programmed according to a word line programming order starting at a source-side word line of a block and proceeding one word line at a time until all data has been programmed partway through the block or until memory cells of a final, drain-side word line of the block has been programmed. Referring to FIG. 7, the memory cells on a given NAND string may be programmed from WL0 to WLn. Thus, WLn−1 may be programmed prior to WLn.

However, note that not all memory cells associated with the selected word line are programmed during the same programming operation. Referring to FIG. 7, typically one memory cells on NAND strings that share select lines are programmed during the same programming operation. Thus, NAND strings NS00, NS10, and others sharing drain select line SGD0 are programmed during the same programming operation. NAND strings NS01, NS11, and others sharing drain select line SGD1 are programmed together during a separate programming operation.

Also note that in FIG. 7, BL0 has a program enable voltage, whereas BL1 has a program inhibit voltage. This is because memory cell 702 is to be programmed during the present programming operation, but memory cell 708 is not to be programmed during the present programming operation. For example, the threshold voltage of memory cell 708 may have already reached its target level.

In step 808, the program voltage (VPGM) is set to an initial value. This is the program voltage that will be applied to the selected word line for the first iteration of the process. This program voltage will be stepped up during the process. Also, in step 808, a program counter (PC) is initialized to zero. The program counter tracks how many program pulses have been applied, such that programming can be aborted if the memory cell does not program within an allowed number of program pulses.

In step 810, channels of NAND strings are pre-charged. This is referred to herein as a pre-charge phase. This pre-charge phase boost the channel potential of unselected NAND strings somewhat, but not all of the way to the desired boosted voltage for preventing program disturb. The pre-charge phase is optional.

In step 812, channels of unselected NAND strings are boosted to a boosting potential. An unselected NAND string is one that does not have a memory cell being programmed. That is, the program pulse to be applied to the selected word line should not program any memory cells on an unselected NAND string. Boosting the channels of unselected NAND strings helps to prevent program disturb. Referring to FIG. 7, the channels of NAND strings NS01, NS02, NS10, NS11, and NS12 may be boosted in step 812. In step 812, Vpass may be applied to control gates of memory cells associated with unselected word lines as depicted in FIG. 7.

In step 814, a program pulse is applied to the selected word line. Referring to FIG. 7, Vpgm is applied to WLn.

In step 816, a verification process is performed. In step 818, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 818 is referring to all states having completed programming.

If verification passes, the programming process is completed successfully (status=pass) in step 820. If all of the memory cells are not all verified, then it is determined whether the program counter (PC) is less than a maximum value such as 20. If the program counter (PC) is not less than max (step 822), then the program process has failed (step 824). If the program counter (PC) is less than a maximum value (e.g., 20), then the program counter (PC) is incremented by 1 and the program voltage is stepped up to the next value in step 826. Subsequent to step 826, the process loops back to step 810 to prepare for and apply the next program pulse to the selected word line.

During a programming process such as, but not limited to, the one of FIG. 8, memory cells are susceptible to program disturb. Under some conditions, program disturb may be worse at higher temperatures. This may be related to additional carrier generation at higher temperature. The additional carrier generation can lead to greater leakage current through the drain side select transistor (as well as the source side select transistor). As noted above, the boosted channel potential can leak through the drain side select transistor to the bit line. Also, the boosted channel potential can leak through the source side select transistor to the source line.

The inventors have discovered that under some conditions, y-mode program disturb and/or xy-mode program disturb may be more severe at low temperatures. For some devices, y-mode program disturb and/or xy-mode program disturb may be more severe at low temperatures when the selected word line is near the drain side select transistor. Thus, there may be a temperature dependence of y-mode program disturb and/or xy-mode program disturb. Also, the amount of y-mode program disturb and/or xy-mode program disturb may depend on the location of the selected word line. For example, the amount of y-mode program disturb and/or xy-mode program disturb may depend on how close the selected word line is to the drain side select transistor.

In one embodiment, the voltage that is applied to the gate terminal of the drain side select transistors of unselected NAND strings while programming a selected NAND string is adjusted based on temperature. In one embodiment, the programming includes applying a programming pulse (e.g., Vpgm) to a selected word line and a boosting voltage (e.g., Vpass) to unselected word lines. This may reduce program disturb such as, but not limited to, y-mode and xy-mode program disturb in 3D NAND. In one embodiment, the adjustment is to increase the voltage applied to the control gate of the drain side select transistor of unselected NAND strings as temperature decreases. A higher voltage applied to the control gate means that the amount of under-drive of certain ones of the drain side select transistors is reduced.

Also note that the Ids-Vgs curve of the drain side select transistors may have an optimum point for the control gate bias to prevent leakage current. If the control gate bias is too low this may lead to an increase in GIDL current. If the control gate bias is too high (but still below Vt) this may lead to an increase in sub-threshold leakage. Thus, there may be a "sweet spot" for the control gate voltage between these two phenomena. Moreover, the Vt of the drain side select transistor changes with respect to temperature. For example, the Vt could be higher as temperature decreases. Additionally, the GIDL effect depends on temperature. Therefore, the "sweet spot" for the control gate voltage can change with temperature. In one embodiment, increasing the control gate voltage at lower temperatures may decrease the total leakage current from all phenomena.

In one embodiment, the voltage that is applied to the gate terminal of the drain side select transistors of unselected NAND strings is adjusted based on location of the word line that is selected for programming. This may reduce program disturb such as, but not limited to, y-mode and xy-mode program disturb in 3D NAND. In one embodiment, the adjustment is to increase the voltage applied to the control gate of the drain side select transistor of unselected NAND strings when the selected word line is closer to the drain side select transistor.

In one embodiment, the voltage that is applied to the gate terminal of the drain side select transistors of unselected NAND strings is adjusted based on both the temperature and the location of the word line that is selected for programming. This may reduce program disturb such as, but not limited to, y-mode and xy-mode program disturb in 3D NAND. In one embodiment, different temperature compensation schemes are used depending on the location of the selected word line relative to the drain side select transistor.

Note that depending on the temperature, different factors may affect program disturb. For example, one possible cause of program disturb is sub-threshold leakage through the drain side select transistor to the bit line, which may reduce the boosted channel potential. As temperature increases, sub-threshold leakage may be expected to be more severe. As noted above, the y-mode program disturb case can be associated with select transistors for which Vgs is about 0V (e.g., about 0V applied to both the gate and to the bit line). Thus, it might be expected that y-mode program disturb would be worse as temperature increases.

Also, as temperature increases, GIDL may be expected to be more severe. As noted above, the xy-mode program disturb case can be associated with select transistors that are under-driven. An under-driven transistor may be expected to suffer from more GIDL as temperature increases. Thus, it might be expected that xy-mode program disturb would be worse as temperature increases.

However, the inventors have discovered that unexpectedly there was an increase in y-mode and xy-mode program disturb at low temperatures, for at least memory cells close to the drain side select transistor. One possible explanation for this effect is as follows. During program verify, electrons may be present in the NAND channel, under at least some circumstances. After program verify, some of the electrons may remain trapped in the NAND channel when the next program pulse is applied. When the temperature is lower, the rate of electron-hole recombination may be less. If there is less electron-hole recombination, then more electrons may remain trapped when the temperature is lower.

Figure 9A:
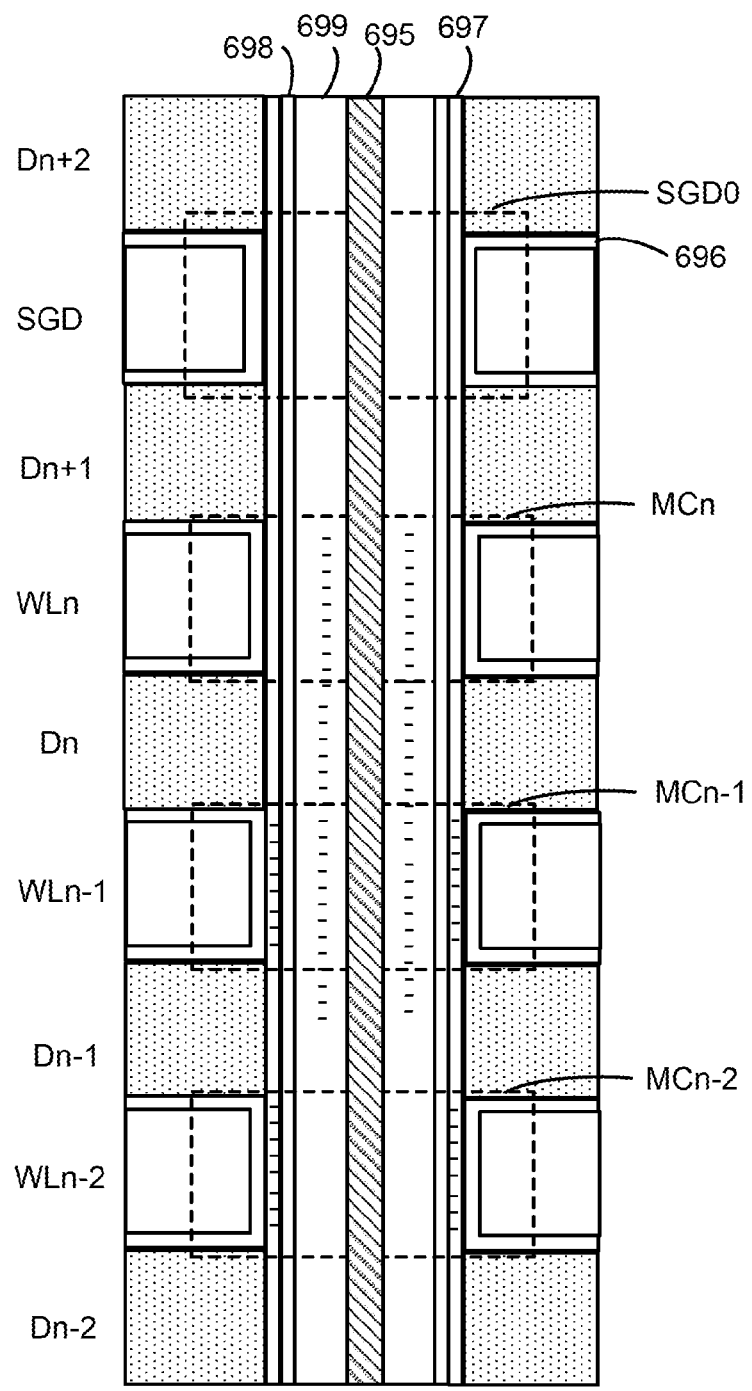
FIG. 9A is a diagram of a portion of a NAND string, showing charges remaining after a program verify.

FIG. 9A depicts a portion of a NAND string in a 3D memory device. The portion includes three memory cells MCn, MCn-1, and MCn-2, which are associated with word lines WLn, WLn-1, and WLn-2, respectively. A drain side select transistor SGD0 is depicted. Also depicted are several dielectric layers Dn-2 through Dn+2. In this embodiment, the blocking layer 696 is outside of the column in which the charge trapping layer 697, tunnel dielectric 698, NAND channel 699, and core 695 reside.

During a portion of the program verify operation, a read reference voltage Vcgr may be applied to the control gate of memory cell MCn. Note that in this example memory cell MCn is not necessarily being programmed at this time. However, its control gate may receive Vcgr because it is associated with the selected word line WLn. Other memory cells may have Vread applied to their control gates. Vread is a voltage that is high enough to turn on the transistors of those memory cells. A voltage Vsgd may be applied to the control gate of the drain side select transistor to turn on the drain side select transistor SGD0 during a portion of the verify operation such that the NAND channel 699 is connected to the bit line. Therefore, sensing circuitry can sense whether the NAND channel conducts. Note that during other portions of the verify operation, the NAND channel 699 might be cut off from the bit line.

FIG. 9A depicts electrons trapped in the channel 699 after a program verify operation in which the NAND string is an unselected NAND string. The electrons are represented by short dashes in the NAND channel 699 between memory cells MCn-1 to MCn. As noted, there may be more trapped electrons at lower temperatures. A possible cause for the greater number of trapped electrons is the lower recombination rate at lower temperatures.

Also note that the number of trapped electrons may depend on the state of memory cells near the selected word line WLn. Note that in some programming sequences, memory cells are programmed from the source line to the bit line. Thus, memory cells associated with, for example, WLn-1 could be in any state. The memory cells could programmed to two states, four states, eight states, etc. Typically, the threshold voltage of the memory cell is increased to program it to successively higher data states. Thus, the charge storage region 697 of the already programmed memory cells could be storing some charge associated with the data state. Memory cells MCn-2 and MCn-1 are depicted with some charge stored in their charge storage region 697. Note that memory cells MCn-2 and MCn-1 are not necessarily programmed to the same state.

Figure 9B:
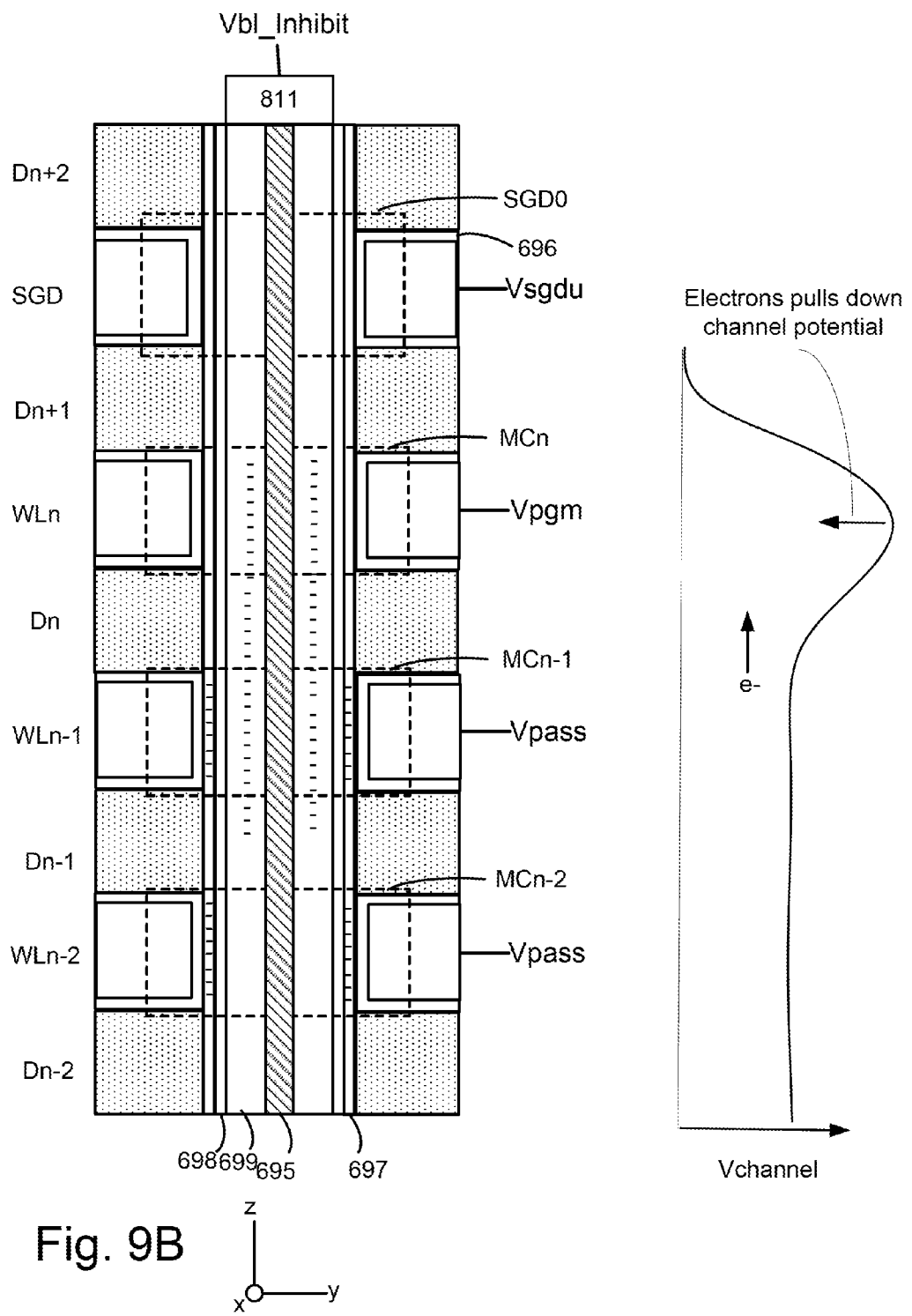
FIG. 9B is a diagram of a portion of a NAND string and channel potential, showing how charges remaining after a program verify may affect the channel potential.

FIG. 9B the unselected NAND string with various voltages that are applied during programming. The programming voltage Vpgm is applied to the selected word line WLn. A boosting voltage Vpass is applied to unselected word lines, WLn-1 and WLn-2. An unselect voltage Vsgdu is applied to the control gate of the drain side select transistor SGD0. A program inhibit voltage Vbl_inhibit is applied to a bit line contact 811 that connects to the end of the NAND channel 699. The drain side select transistor SDG0 should be off, which allows the channel boosting to occur.

The channel voltage is also depicted in FIG. 9B, with one axis of the graph labeled "Vchannel". The other axis of the graph corresponds to the channel location in the z-direction. The channel voltage is greatest adjacent to the selected word line WLn, as the program voltage Vpgm is greater than the boosting voltage Vpass. However, the boosting voltage Vpass also boosts the channel potential adjacent to the unselected word lines WLn-1, WLn-2 (and other unselected word lines not depicted in FIG. 9B).

The trapped electrons in the NAND channel 699 may migrate to the portion of the NAND channel that has the highest potential. Thus, the electrons can pull down the channel potential adjacent to the selected word line WLn. This can reduce the effectiveness of the channel boosting. Therefore, memory cell MCn (which is not selected for programming) may suffer program disturb.

Note that the foregoing is just one possible explanation for program disturb at lower temperatures. There may be a variety of factors that lead to y-mode and xy-mode program at lower temperatures.

FIG. 10 depicts an example temperature-based programming operation. The process may be used when programming 3D vertical NAND strings. The example depicted in FIG. 7 will be referred to when discussing the process. The process can be used as a part of one loop of the programming process of FIG. 8. In particular, the process can be performed in connection with steps 810-814. Note that the steps are not necessarily performed in the depicted order.

Step 1006 includes applying a program voltage to the selected word line. Referring to FIG. 7, Vpgm is applied to WLn. Note that WLn is associated with several memory cells 702, 704, 706, 708, 710, and 712. However, not all of those memory cells are selected for programming, in this example. Rather, in this example, only memory cell 702 of those cells is selected for programming.

Step 1008 includes applying a boosting voltage to unselected word lines. Referring to FIG. 7, Vpass is applied to WL0 through WLn−1.

Step 1010 includes applying a voltage to a bit line associated with an unselected NAND string. This voltage could refer to either a program enable voltage or a program inhibit voltage. Referring to FIG. 7, this could refer to applying Vbl_Program_Enable to BL0. Note that although NAND string NS00 is selected, NAND strings NS01 and NS02 are not selected. Referring to FIG. 7, this could also refer to applying Vbl_Inhibit to BL1. Note that NAND strings NS10, NS11 and NS12 are not selected for programming. As mentioned above, a reason why NAND string NS10 is not presently selected for programming may be that its threshold voltage has already reached the target level. Thus, referring to FIG. 8, NAND string NS10 is not selected for this particular program loop. However, the other unselected NAND strings NS01, NS02, NS11, and NS12 are not selected as none of their memory cells are being programmed during a programming operation with multiple loops, such as in FIG. 8.

Step 1012 includes applying an unselect voltage to a control gate of a drain side select transistor of unselected NAND strings that is temperature dependent and that depends on the location of the selected word line. In one embodiment, the temperature scheme depends on the location of the selected word line. Referring to FIG. 7, this could also refer to applying Vsgdu to the control gate of any of drain side select transistors 724, 726, 730, and/or 732. Note that this includes the drain side select transistors of NAND strings NS01, NS02 whose memory cells are currently subject to "y-mode" program disturb. Note that this also includes the drain side select transistors of NAND strings NS11, NS12 whose memory cells are currently subject to "xy-mode" program disturb. The temperature dependent unselect voltage helps to reduce or prevent the aforementioned program disturb.

Figure 12:
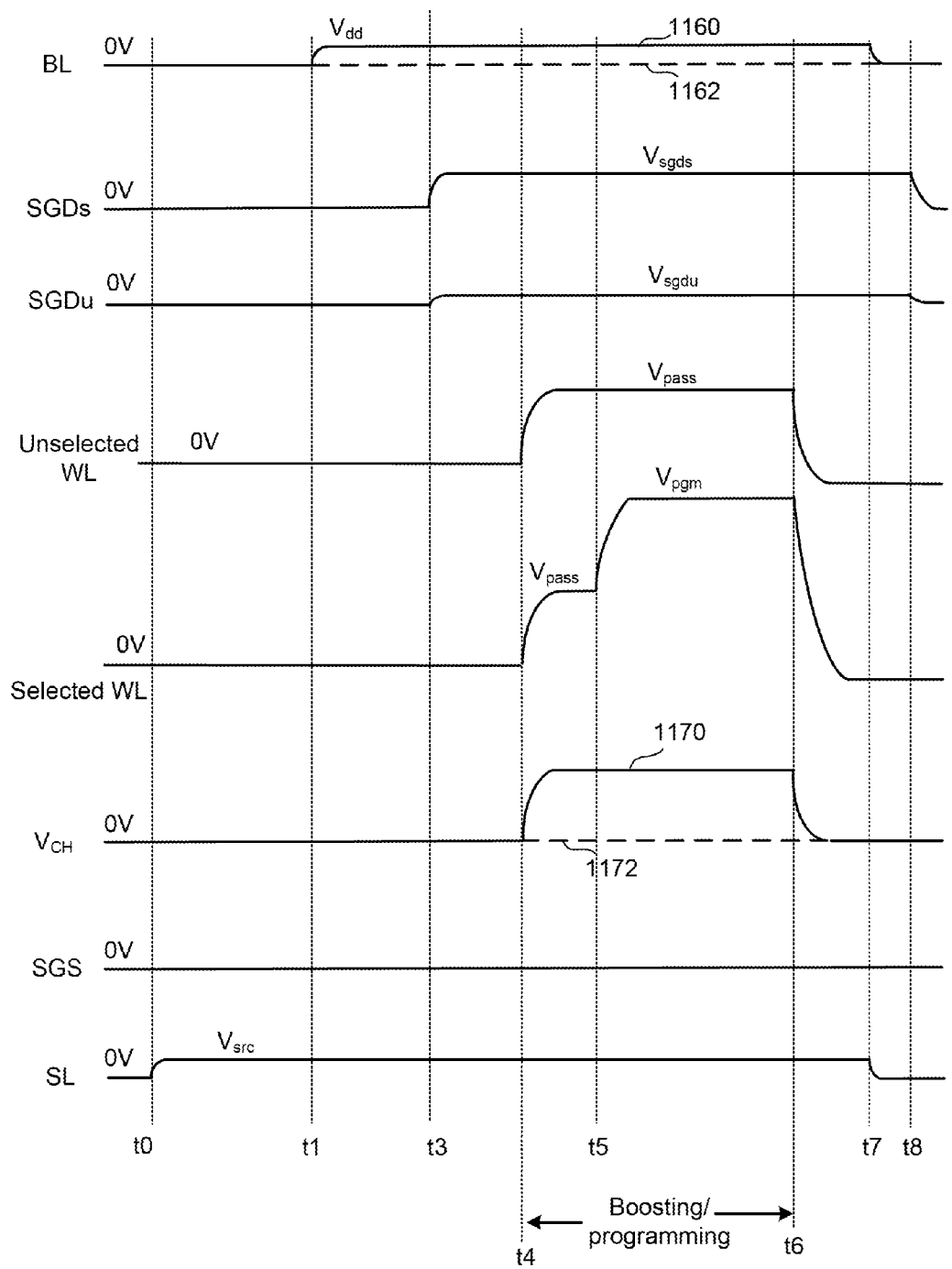
FIG. 12 shows timing of various signals during one embodiment of the process of FIG. 11.

FIG. 11 is a flowchart of one embodiment of programming non-volatile storage. This process is used to program 3D NAND in one embodiment. FIG. 12 shows timing of various signals during one embodiment of the process of FIG. 11.

A low voltage is applied to the source line at step 1102. Referring to FIG. 12, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 12 are at 0V at time t0.

At step 1104, the data is applied to the bit lines. Referring to FIG. 7, the bit lines are associated with set of NAND strings that are a part of the present programming operation and several sets of NAND strings that are not a part of the present programming operation. For example, NAND strings NS00, NS10, and other NAND strings associated with select line SGD0 are part of the present programming operation. NAND strings NS01, NS11, and other NAND strings associated with select line SGD1 are not part of the present programming operation. Likewise, NAND strings NS02, NS12, and other NAND strings associated with select line SGD2 are not part of the present programming. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. Referring to FIG. 7, BL0 has Vbl_Program_Enable applied thereto because memory cell 702 is to be programmed. If the memory cell is not to be programmed, then its associated bit line has a program inhibit voltage (e.g., Vbl_Inhibit) applied to it. Referring to FIG. 7, BL1 has Vbl_Vbl_Inhibit applied thereto because memory cell 708 is not to be programmed at this point in the programming operation. Note that even though memory cells 704 and 706 are not to be programmed, their associated bit lines have Vbl_Program_Enable applied thereto due to the physical configuration.

Referring to FIG. 12, line 1162 shows the bit line voltage at 0V for a NAND string (in the set that are a part of the present programming operation) having a memory cell at the selected word line WLn that is to be programmed (such as memory cell 702 in FIG. 7). Line 1160 shows the bit line voltage at VDD for a NAND string (in the set that are a part of the present programming operation) having a cell at WLn that is to be inhibited from programming (such as memory cell 708 in FIG. 7). VDD designates program inhibit and is often referred to as a program inhibit voltage. Note that line 1162 represents one example of V_Program_Enable, and that line 1160 represents one example of Vbl_Inhibit.

Step 1106 is to apply Vsgds to selected drain side select lines. Step 1108 is to apply Vsgdu to unselected drain side select lines. Note that FIG. 12 shows two SGD lines. Line SGDs refers to a drain side select line having at least one NAND string that is currently programming. One of example of this is SGD0 in FIG. 7. Line SGDu refers to a drain side select line having no NAND strings currently programming. Examples of this are SGD1 and SGD2 in FIG. 7.

Referring to FIG. 12, at time t3, drain side select line SGDs is raised to Vsgds, and drain side select line SGDu is raised to Vsgdu. The voltage Vsgds turns on the drain side select transistor for NAND strings having a memory cell being programmed. Referring to FIG. 7, drain side select transistor 722 will be turned on at time t3. Note that Vbl_Program_Enable is being applied to the selected bit line BL0 at time t3.

Note that at this time Vsgds may also be applied to control gates of drain side select transistors of NAND strings for which no memory cell should be programmed. For example, in FIG. 7, Vsgds is being applied to drain side select transistor 728. However, note that Vbl_Inhibit is being applied to the unselected bit line BL1 at time t3. This combination should keep drain side select transistor 728 off.

Referring again to FIG. 12, at time t3, drain side select line SGDu is set to Vsgdu. The voltage Vsgdu should keep off the associated drain side select transistor. Referring to FIG. 7, drain side select transistor 724 will have Vsgdu applied to its control gate and Vbl_Program_Enable applied to the associated bit line BL0 at time t3. This combination should keep drain side select transistor 724 off. Similar reasoning applies to drain side select transistor 726. Drain side select transistor 730 will have Vsgdu applied to its control gate and Vbl_Inhibit applied to the associated bit line BL1 at time t3. This combination should keep drain side select transistor 730 off. Similar reasoning applies to drain side select transistor 732.

The magnitude of Vsgdu depends on the location of the selected word line in one embodiment. The magnitude of Vsgdu depends on both the location of the selected word line and the temperature in one embodiment. For example, different temperature compensation schemes may be used for different word lines. In one embodiment, the greatest amount of temperature compensation is used when the selected word line is closest to the drain select transistor.

At step 1116, a boosting voltage (e.g., VPASS) is applied to unselected word lines. Note that the magnitude for VPASS does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 12, at time t4, the boosting/programming phase begins. The boosting voltages are applied to the various word lines at time t4. In one embodiment, each unselected word line receives a boosting voltage VPASS. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

In one embodiment, the unselected word lines may receive different pass voltages. For example, in one LSB embodiment, many of the unselected word lines receive a VPASS of, for example, 10V, while one or more receive a voltage less than 10V. In one EASB embodiment, many of the unselected word lines receive a VPASS of, for example, 10 V, while one or more receive a voltage less than 10V. Some unselected word lines could receive a voltage greater than the normal VPASS in one embodiment.

The channel voltage $V_{CH}$ of the inhibited NAND string rises in accordance with the boosting voltage applied to the word lines as shown at 1170. In some implementations, about a 50% coupling ratio between channel and word line can be expected. However, the coupling ratio can vary depending on implementation. For the NAND string enabled for programming, the channel region remains at 0V as shown at 1172 because the drain select transistor is on and 0V is applied to the bit line.

The program voltage VPGM is then applied to the selected word line at step 1118. With the boosting voltages applied and the inhibited NAND string channels boosted, program disturb of unselected memory cells on the selected word line is prevented or reduced.

Referring to FIG. 12, at time t5, the program voltage VPGM is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 1120, the word lines, bit lines, source lines, and drain select lines are lowered to 0V, marking the completion of one programming iteration. It should be noted that the steps of FIG. 11 can be applied with each iteration of the process of FIG. 8, with the program voltage being increased each iteration. However, it is not required that the program voltage increase in magnitude with each iteration.

Referring to FIG. 11, at time t6, the word lines are lowered to 0V. The source and bit lines are then lowered to 0V at time t7. The drain select line SGD is lowered to 0V at time t8. Numerous variations to the signals depicted in FIG. 12 can be made in accordance with embodiments.\

In one embodiment, channels of at least some of the unselected NAND strings are pre-charged prior to the boosting phase. This can be done by raising the unselected bit lines just prior to time t1 in FIG. 12. Vbl_inhibited is initially at 0 V at time t0 and is stepped up to Vbl_high in the pre-charge phase just prior to time t1. With SGDs and SGDu at 0 V in the pre-charge phase, the drain side select transistors are reverse biased with a magnitude of Vbl_high. If the magnitude of Vbl_high is greater than a threshold level for generating GIDL, electron-hole pairs will be generated at the drain of the drain side select transistors. The electrons will be swept toward the bit line due to the positive voltage (Vbl_high) and the holes will migrate in the channel, thereby gradually boosting the voltage of the channel to a Vpre-charge level. For example, the threshold level for generating GIDL may be about 4-6 V and Vbl_high may be about 8 V or more. Vpre-charge may be about 1.5V, for instance.

Figure 13A:
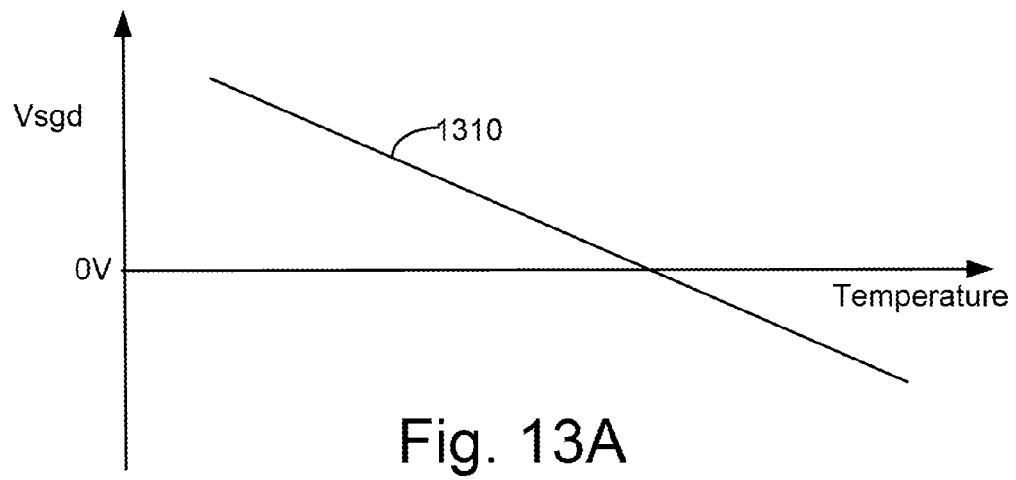
FIGS. 13A and 13B depict two alternative temperature compensation schemes.
Figure 13B:
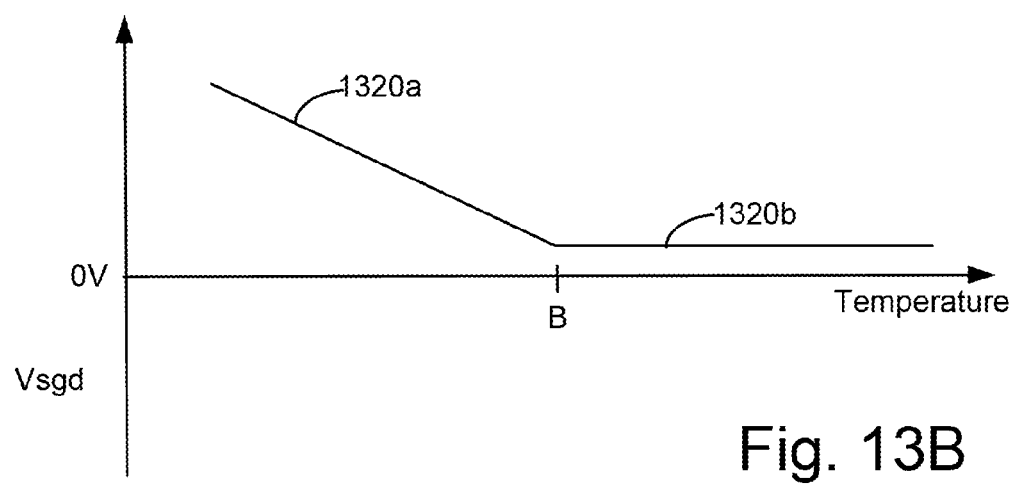

FIGS. 13A and 13B depict two alternative temperature compensation schemes. These schemes could be used when generating a voltage for a control gate of a drain side select transistor during a programming operation. For example, these alternative temperature compensation schemes could be used during step 1012 of FIG. 10 or step 1108 of FIG. 11, but are not limited to those steps. Thus, the Vsgd in FIGS. 13A and 13B could be, but is not limited to, the unselect voltage Vsdgu as depicted in FIGS. 7 and/or 12.

In the embodiment depicted in FIG. 13A, the adjustment is linear with respect to temperature across all normal operating temperatures. Curve 1310 depicts the relationship between Vsdg and temperature. The curve 1310 shows that Vsgd is greater when temperature is lower. In this example, Vsdg is less than 0V at higher temperatures. The slope of the curve 1310 may be referred to as a temperature coefficient. The temperature coefficient may be expressed as a value such as "x millivolts per degree Celsius." This is referred to as "linear temperature compensation" because the curve 1310 is a straight line. Curve 1310 thus depicts "linear temperature compensation" that varies linearly with respect to temperature across all operating temperatures. In this example, the endpoints of curve 1310 represent the endpoints of the normal operating temperatures.

In the embodiment depicted in FIG. 13B, there is a break in the curve 1320 at a temperature of B degrees, which may be referred to as the breakpoint temperature. Below B degrees, the section of the curve 1320a is such that Vsgd increases as temperature decreases. However, above B degrees, the section of the curve 1320b levels off such that Vsgd will not drop below 0V. Thus, the first temperature compensation scheme (below B) increases the unselect voltage as temperature decreases, wherein the second temperature compensation scheme (above B) keeps the unselect voltage greater than or equal to zero volts. This alleviates the need to use a negative Vsgd at high temperatures.

Note that there are two different temperature coefficients in FIG. 13B. A first temperature coefficient is associated with the slope of section 1320a and a second temperature coefficient is associated with the slope of section 1320b. Thus, in one embodiment, the managing circuitry is configured to generate the unselect voltage (e.g., Vsdgu) using a first temperature coefficient below a breakpoint temperature and to generate the unselect voltage using a second temperature coefficient above the breakpoint temperature. The first temperature coefficient provides greater temperature compensation than the second temperature coefficient, in one embodiment. The second temperature coefficient does not provide any temperature compensation, in one embodiment. This can prevent the unselect voltage from going below 0V.

Moreover, it may be that the most significant y-mode and/or xy-mode program disturb occurs at lower temperatures. Thus, the temperature compensation only starts when temperature is below some target level (e.g., B degrees). Thus, the breakpoint B can be selected to provide temperature compensation to reduce y-mode and/or xy-mode program disturb that occurs at low temperatures without the need to generate a negative voltage for Vsdg at higher temperatures.

In the example of FIG. 13B, the second temperature coefficient associated with the slope of section 1320b may be zero. For example, 0 mV of temperature compensation are provided per degree Celsius above the breakpoint temperature. However, another possibility is for there to be some temperature compensation above the breakpoint temperature, but for this to be less than the temperature compensation below the breakpoint temperature.

In one embodiment, different temperature compensation schemes are used for different word lines. FIG. 14 depicts a table that illustrates one embodiment in which different temperature compensation schemes are used depending in which zone the selected word line is in. There may be one or more word lines in a zone. In one embodiment, there is a different zone for each word line. In one embodiment, one zone covers one or a few word lines near the drain side select transistor. In this example, there are three zones. However, there may be just two zones or there may be more than three zones. The zones are based on the location of the selected word line relative to the drain side select transistor. The closer that the selected word line is to the drain side select transistor, the more temperature compensation is applied. The temperature compensation refers to a temperature coefficient ("Tco") of a voltage applied to a control gate of the drain side select transistor during a programming operation, in one embodiment. For example, the voltage may be applied to a drain select line in a 3D memory device for which no NAND strings are selected. The temperature coefficient may be a parameter such as "x millivolts per degree Celsius." Thus, a temperature coefficient of −2 millivolts per degree Celsius would reduce the voltage by 2 millivolts per degree Celsius. A temperature coefficient of −5 millivolts per degree Celsius would provide greater temperature compensation than one of −2 millivolts per degree Celsius, as the curve of Vsgd versus temperature would have a greater slope. Equation 1 provides one example of how a temperature compensated voltage can be derived mathematically.

$$Vsgd = Vsgdnom + Tco * Temp \quad (1)$$

In Equation 1, Vsgd is the temperature compensated voltage for the control gate of the drain side select transistor, Vsgdnom is a nominal voltage for the control gate of the drain side select transistor, Tco is a temperature coefficient, and Temp is the present temperature in, for example, degrees Kelvin. In Equation 1, Tco might be a parameter such as "−2 millivolts per degree Kelvin".

FIGS. 15A and 15B shows graphs that depict how different temperature compensation might be applied depending on, for example, the word line zone. FIG. 15A shows a curve 1510 in which no temperature compensation is used (e.g., the slope of curve 1510 is zero). FIG. 15B shows a curve 1520a in which the slope of the Vsgd versus temperature curve is lower than for curve 1320a. Note that this is for the example in which there is a breakpoint temperature, but could also be applied to the linear scheme of FIG. 13A.

Thus, for the sake of illustration, a scheme such as curve 1510 might be used for zone 1, a scheme such as curve 1520 (which includes sections 1520a and 1520b) might be used for zone 1, and a scheme such as curve 1320 (which includes sections 1320a and 1320b) might be used for zone 2. This would provide the greatest temperature compensation for word lines nearest the drain side select transistor. Many more variations are possible. A possible reason for providing greater temperature compensation for zones nearer the drain side select transistor is that program disturb that occurs at low temperatures may be worse for selected word lines nearest the drain side select transistor.

Thus, in one embodiment, the managing circuitry is configured to generate an unselect voltage (e.g., Vsgdu) for a drain side select line using a first temperature coefficient when the selected word line is in a first zone and to generate the unselect voltage using a second temperature coefficient when the selected word line is in a second zone. The first temperature coefficient provides greater temperature compensation than the second temperature coefficient. The first zone is closer to the drain side select transistor than the second zone.

In one embodiment, the unselect voltage (e.g., Vsgdu) has a greater magnitude for a given temperature (for at least some range of temperatures) when the selected word line is closer to the drain side select transistor. For example, referring to curves 1320a and 1520a in FIG. 15B, for any temperature below B, Vsgd will be greater on curve 1320a than curve 1520a. If curve 1320a is associated with a zone closer to the drain side select transistor then curve 1520a, then for foregoing will hold.

Accordingly, it can be seen that, in one embodiment, a non-volatile storage device, comprises a semiconductor substrate having a major surface that extends in a horizontal plane; a plurality of word lines; a plurality of bit lines; a plurality of NAND strings that extend in a vertical direction with respect to the horizontal plane, and managing circuitry in communication with the plurality of word lines, the plurality of bit lines, and the drain side select transistors of the plurality of NAND strings. Each of the NAND strings comprises a drain side select transistor coupled to a bit line of the plurality of bit lines. Each of the NAND strings being associated with a group of the plurality of word lines. The managing circuitry is configured to apply a programming voltage to a selected word line of the plurality of word lines that is associated with a selected NAND string and with an unselected NAND string of the plurality of NAND strings. The managing circuitry is configured to apply a program enable voltage to a selected bit line that is associated with the selected NAND string. The managing circuitry is configured to apply a voltage to a bit line associated with the unselected NAND string. The managing circuitry is configured to generate an unselect voltage that has a magnitude that depends on temperature and location of the selected word line along the unselected NAND string. The managing circuitry is configured to apply the unselect voltage to a gate of the drain side select transistor of the unselected NAND string while the managing circuitry applies the programming voltage to the selected word line and the voltage to the bit line associated with the unselected NAND string.

One embodiment includes a method of operating three-dimensional (3D) non-volatile storage. The method comprises applying a program voltage to a word line associated with a selected NAND string. The word line is associated with an unselected NAND string. The selected and unselected NAND strings extend in a vertical direction with respect to a major surface of a semiconductor substrate that extends in a horizontal plane. A boosting voltage is applied to unselected word lines associated with the unselected NAND string. A voltage is applied to a bit line associated with the unselected NAND string. An unselect voltage is applied to a drain side select transistor of the unselected NAND string while applying the programming voltage to the selected word line, the boosting voltage to the unselected word lines, and the voltage to the bit line associated with the unselected NAND string. A magnitude of the unselect voltage is based on temperature and on location of the selected word line relative to the drain side select transistor of the unselected NAND. The unselect voltage cuts off the unselected NAND string from the bit line associated with the unselected NAND string.

One embodiment includes a three-dimensional (3D) non-volatile storage device, comprising: a semiconductor substrate having a major surface that extends in a horizontal plane; a plurality of word lines that extend in the horizontal plane, each word line is a different distance from the semiconductor substrate; a plurality of bit lines; a plurality of NAND strings that extend in a vertical direction with respect to the horizontal plane, each of the NAND strings comprising a plurality of memory cells and a drain side select transistor coupled to a bit line of the plurality of bit lines, wherein each of the memory cells is associated with a word line of the plurality of word lines; a plurality of drain select lines, wherein each of the drain select lines is connected to a gate of the drain side select transistor of a group of the NAND strings; and managing circuitry in communication with the plurality of word lines, the plurality of bit lines, and the drain side select transistors of the plurality of NAND strings. The managing circuitry applies a programming voltage to a selected word line that is associated with groups of the NAND strings. Each of the groups of NAND strings is associated with a different drain select line. The managing circuitry applies a boosting voltage to unselected word lines that are associated with the groups the NAND strings. The managing circuitry applies a program enable voltage to a selected bit line. The managing circuitry applies a program inhibit voltage to an unselected bit line. A first group of the NAND strings comprises a first NAND string that is associated with the selected bit line and a second NAND string that is associated with the unselected bit line. A second group of the NAND strings comprises a third NAND string that is associated with the selected bit line and a fourth NAND string that is associated with the unselected bit line. The managing circuitry accesses an unselect voltage that has a magnitude that has a temperature dependence. The temperature dependence depends on how close the selected word line is to the drain side select transistors. The managing circuitry applies a select voltage to the drain select line that is associated with the first group of NAND strings and applies the unselect voltage to the drain select line that is associated with the second group of NAND strings while the managing circuitry applies the programming voltage to the selected word line, the boosting voltage to the unselected word line, the program enable voltage to the selected bit line, and the program inhibit voltage to the unselected bit line. The unselect voltage applied to the drain select line associated with the second group of NAND strings cuts off the NAND strings in the second group from their associated bit lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
    a plurality of word lines;
    a plurality of bit lines;
    a plurality of NAND strings in a three dimensional memory array, each of the NAND strings comprising a drain side select transistor coupled to a bit line of the plurality of bit lines, each of the NAND strings being associated with a group of the plurality of word lines; and
    managing circuitry in communication with the plurality of word lines, the plurality of bit lines, and the drain side select transistors of the plurality of NAND strings, wherein the managing circuitry is configured to generate an unselect voltage that has a magnitude that depends on temperature and location of a selected word line along an unselected NAND string, wherein the managing circuitry is configured to apply the unselect voltage to a control gate of the drain side select transistor of the unselected NAND string while a programming voltage is applied to the selected word line, while a boosting voltage is applied to unselected word lines associated with the unselected NAND string, and while a voltage is applied to a bit line associated with the unselected NAND string.

2. The non-volatile storage device of claim 1, wherein the managing circuitry is configured to generate a first unselect voltage when the selected word line is the closest data word line to the drain side select transistor and a second unselect voltage when the selected word line is several data word lines away from the drain side select transistor, wherein the first unselect voltage provides greater temperature compensation than the second unselect voltage.

3. The non-volatile storage device of claim 1, wherein the managing circuitry is configured to generate the unselect voltage using a first temperature coefficient when the selected word line is in a first zone and to generate the unselect voltage using a second temperature coefficient when the selected word line is in a second zone, wherein the first temperature coefficient provides greater temperature compensation than the second temperature coefficient, wherein the first zone is closer to the drain side select transistor than the second zone.

4. The non-volatile storage device of claim 1, wherein the managing circuitry being configured to generate the unselect voltage comprises the managing circuitry being configured to generate the unselect voltage having a magnitude that provides a linear temperature compensation to the drain side select transistor of the unselected NAND string, wherein the linear temperature compensation varies linearly with respect to temperature across all operating temperatures.

5. The non-volatile storage device of claim 1, wherein the managing circuitry is configured to generate the unselect voltage that has a first temperature coefficient below a breakpoint temperature and to generate the unselect voltage that has a second temperature coefficient above the breakpoint temperature, wherein the first temperature coefficient provides greater temperature compensation to the drain side select transistor of the unselected NAND string than the second temperature coefficient.

6. The non-volatile storage device of claim 1, wherein the managing circuitry is configured to apply a program inhibit voltage to the bit line associated with the unselected NAND string while the managing circuitry applies the unselect voltage to the control gate of the drain side select transistor of the unselected NAND string, wherein the unselect voltage applied to the gate of the drain side select transistor keeps the drain side select transistor off.

7. The non-volatile storage device of claim 1, wherein the bit line associated with the unselected NAND string is a selected bit line, wherein the unselect voltage applied to the gate of the drain side select transistor keeps the drain side select transistor off.

8. The non-volatile storage device of claim 1, wherein the managing circuitry is configured to apply a program enable voltage to the bit line associated with the unselected NAND string while the managing circuitry applies the unselect voltage to the control gate of the drain side select transistor of the unselected NAND string.

9. The non-volatile storage device of claim 1, wherein the managing circuitry configured to generate an unselect voltage that has a magnitude that depends on temperature comprises the managing circuitry configured to increase the magnitude of the unselect voltage as temperature decreases.

10. A method comprising:
generating an unselect voltage that has a magnitude that depends on temperature and location of a selected word line along an unselected NAND string in a three-dimensional memory array, wherein the magnitude of the unselect voltage is based on temperature and on location of the selected word line relative to a drain side select transistor of the unselected NAND; and
applying the unselect voltage to a control gate of the drain side select transistor of the unselected NAND string while a programming voltage is applied to the selected word line, while a boosting voltage is applied to unselected word lines associated with the unselected NAND string, and while a voltage is applied to a bit line associated with the unselected NAND string, wherein the unselect voltage cuts off the unselected NAND string from a bit line associated with the unselected NAND string.

11. The method of claim 10, wherein the magnitude of the unselect voltage provides a greatest amount of temperature compensation to the drain side select transistor of the unselected NAND string when the selected word line is the closest data word line to the drain side select transistor.

12. The method of claim 10, wherein the unselect voltage is linear with respect to temperature, wherein temperature compensation varies linearly with respect to temperature across all operating temperatures.

13. The method of claim 10, wherein applying the unselect voltage to the control gate of the drain side select transistor of the unselected NAND string comprises:
applying a first temperature compensation scheme below a breakpoint temperature; and
applying a second temperature compensation scheme above the breakpoint temperature.

14. The method of claim 13, wherein applying the first temperature compensation scheme increases the magnitude of the unselect voltage as temperature decreases, wherein applying the second temperature compensation scheme keeps the unselect voltage greater than or equal to zero volts.

15. The method of claim 10, wherein applying the unselect voltage to the control gate of the drain side select transistor of the unselected NAND string comprises:
applying a first temperature compensation scheme when the selected word line is a data word line closest to the drain side select transistor; and
applying a second temperature compensation scheme when the selected word line is several word lines away from the drain side select transistor, wherein the first temperature compensation scheme provides greater temperature compensation than the second temperature compensation scheme.

16. The method of claim 10, further comprising:
applying a program enable voltage to the bit line associated with the unselected NAND string while applying the unselect voltage to the control gate of the drain side select transistor of the unselected NAND string, wherein the bit line associated with the unselected NAND string is also associated with a selected NAND string.

17. The method of claim 10, further comprising:
applying a program inhibit voltage to the bit line associated with the unselected NAND string while applying the unselect voltage to the control gate of the drain side select transistor of the unselected NAND string.

18. A non-volatile storage device, comprising:
a three dimensional memory array comprising: a plurality of word lines, a plurality of bit lines, and a plurality of NAND strings, each of the NAND strings comprising a drain side select transistor coupled to a bit line of the plurality of bit lines, each of the NAND strings being associated with a group of the plurality of word lines; and
means for applying a program voltage to a word line associated with a selected NAND string, wherein the word line is associated with an unselected NAND string;
means for applying a boosting voltage to unselected word lines associated with the unselected NAND string;
means for applying a voltage to a bit line associated with the unselected NAND string; and
means for applying an unselect voltage to a drain side select transistor of the unselected NAND string while the programming voltage is applied to the selected word line, while the boosting voltage is applied to the unselected word lines, and while the voltage is applied to the bit line associated with the unselected NAND string, wherein a magnitude of the unselect voltage is based on temperature and on location of the selected word line relative to the drain side select transistor of the unselected NAND, wherein the unselect voltage cuts off the unselected NAND string from the bit line associated with the unselected NAND string.

19. The non-volatile storage device of claim 18, wherein the means for applying a voltage to a bit line associated with the unselected NAND string comprises:
- means for applying a program enable voltage to the bit line associated with the unselected NAND string, wherein the bit line associated with the unselected NAND string is also associated with a selected NAND string.

20. The non-volatile storage device of claim 18, wherein the means for applying a voltage to a bit line associated with the unselected NAND string comprises:
- means for applying a program inhibit voltage to the bit line associated with the unselected NAND string while the unselect voltage is applied to the drain side select transistor of the unselected NAND string.

* * * * *